US012586592B2

(12) United States Patent
Jangi et al.

(10) Patent No.: US 12,586,592 B2
(45) Date of Patent: Mar. 24, 2026

(54) METHODS AND APPARATUS FOR GENERATING AUDIO FINGERPRINTS FOR CALLS USING POWER SPECTRAL DENSITY VALUES

(71) Applicant: Ribbon Communications Operating Company, Inc., Westford, MA (US)

(72) Inventors: Shrirang Jangi, Acton, MA (US); Vilas Bhade, Acton, MA (US)

(73) Assignee: Ribbon Communications Operating Company, Inc., Westford, MA (US)

( * ) Notice: Subject to any disclaimer, the term of this patent is extended or adjusted under 35 U.S.C. 154(b) by 0 days.

(21) Appl. No.: 17/882,447

(22) Filed: Aug. 5, 2022

(65) Prior Publication Data

US 2023/0386484 A1 Nov. 30, 2023

Related U.S. Application Data

(60) Provisional application No. 63/346,989, filed on May 30, 2022.

(51) Int. Cl.
*G10L 25/18* (2013.01)
*G10L 19/02* (2013.01)
(Continued)

(52) U.S. Cl.
CPC ........... *G10L 19/02* (2013.01); *H03M 7/3073* (2013.01)

(58) Field of Classification Search
CPC ..... G10L 19/02; G10L 19/0204; G10L 25/18; G10L 25/21; G10L 25/69; G10L 25/78;
(Continued)

(56) References Cited

U.S. PATENT DOCUMENTS 8,160,877 B1 * 4/2012 Nucci ..................... G10L 17/06
704/247
8,934,383 B1 * 1/2015 McConkey ......... H04L 65/1045
370/338
(Continued)

FOREIGN PATENT DOCUMENTS

CN 110602303 A 12/2019
EP 1667106 A1 * 6/2006 ......... G06K 9/00523
(Continued)

OTHER PUBLICATIONS

"Spectral density", Wikipedia, 11 Pages, downloaded Sep. 4, 2024.*
(Continued)

*Primary Examiner* — Martin Lerner
(74) *Attorney, Agent, or Firm* — Straub & Straub; Stephen T. Straub; Michael P. Straub

(57) ABSTRACT

The present invention relates to methods, systems, and apparatus for processing audio signals. An exemplary method embodiment includes the steps of: removing silence from an audio signal; determining, for a plurality of time segments of the audio signal, power spectral density values of the audio signal for each of a plurality of N different frequency bins, N being an integer greater than 1; identifying (i) a plurality of dominant frequency peaks based on the determined power spectral density values, and (ii) positions in the audio signal corresponding to the identified peaks; and generating a first audio fingerprint from at least some of the identified plurality of dominant frequency peaks and the identified positions in the audio signal corresponding to the identified peaks. In various embodiments, audio fingerprints are generated from an audio signal of call and then used to determine if the call is a robocall or SPAM call.

24 Claims, 13 Drawing Sheets

(51) Int. Cl.
*G10L 25/51* (2013.01)
*H03M 7/30* (2006.01)

(58) Field of Classification Search
CPC ....... G10L 21/003; G10L 21/01; G10L 25/51;
H04M 3/436; H04M 2203/2027
USPC ................ 704/205, 206, 210, 215, 270, 500
See application file for complete search history.

(56) References Cited

U.S. PATENT DOCUMENTS

| | | | | |
|---|---|---|---|---|
| 9,065,409 | B2 * | 6/2015 | Sandgren | G10L 25/24 |
| 9,437,204 | B2 * | 9/2016 | Grancharov | G10L 19/038 |
| 9,762,731 | B1 | 9/2017 | Cohen | |
| 10,089,994 | B1 * | 10/2018 | Radzishevsky | G10L 19/018 |
| 10,110,741 | B1 * | 10/2018 | Cohen | G10L 25/51 |
| 10,121,488 | B1 * | 11/2018 | Drews | G10L 25/51 |
| 10,666,792 | B1 * | 5/2020 | Marzuoli | G10L 15/26 |
| 10,798,241 | B1 * | 10/2020 | Quilici | H04M 3/42059 |
| 10,878,838 | B1 * | 12/2020 | Mayol Cuevas | G10L 25/51 |
| 11,153,436 | B2 * | 10/2021 | Aravena | G10L 15/22 |
| 11,343,374 | B1 | 5/2022 | Rolia et al. | |
| 11,978,461 | B1 * | 5/2024 | Radzishevsky | G10L 19/018 |
| 2003/0176934 | A1 * | 9/2003 | Gopalan | G10L 19/018 |
| | | | | 700/94 |
| 2006/0143190 | A1 | 6/2006 | Haitsma et al. | |
| 2007/0192390 | A1 * | 8/2007 | Wang | H03H 17/0685 |
| | | | | 708/270 |
| 2008/0178288 | A1 | 7/2008 | Alperovitch et al. | |
| 2011/0173208 | A1 * | 7/2011 | Vogel | G10L 25/48 |
| | | | | 708/207 |
| 2012/0215853 | A1 | 8/2012 | Sundaram et al. | |
| 2013/0259211 | A1 * | 10/2013 | Vlack | G10L 25/54 |
| | | | | 379/88.01 |
| 2015/0279381 | A1 * | 10/2015 | Goesnar | G10L 19/018 |
| | | | | 704/500 |
| 2018/0007199 | A1 | 1/2018 | Quilici et al. | |
| 2018/0294959 | A1 * | 10/2018 | Traynor | H04L 65/1076 |
| 2020/0257722 | A1 | 8/2020 | Zhang et al. | |
| 2020/0296510 | A1 * | 9/2020 | Li | G10L 25/51 |
| 2021/0092223 | A1 | 3/2021 | Gallagher et al. | |
| 2021/0136200 | A1 * | 5/2021 | Li | G10L 17/26 |
| 2022/0086175 | A1 | 3/2022 | Bharrat et al. | |
| 2022/0247866 | A1 | 8/2022 | Xiao-Devins et al. | |
| 2022/0270017 | A1 * | 8/2022 | Singh | G10L 25/78 |
| 2022/0399945 | A1 * | 12/2022 | Frenkel | G10L 25/30 |
| 2023/0388414 | A1 | 11/2023 | Bharrat et al. | |

FOREIGN PATENT DOCUMENTS

| | | | | |
|---|---|---|---|---|
| EP | 3023884 | A1 * | 5/2016 | |
| EP | 3324607 | A1 | 5/2018 | |
| EP | 3937474 | A1 * | 1/2022 | ............ G10L 17/26 |
| GB | 2455505 | A | 6/2009 | |

OTHER PUBLICATIONS

"Spectral density", Wikipedia, 11 Pages, downloaded Mar. 19, 2025 (Year: 2025).*

Richard Harter, The minimum on a sliding window algorithm, downloaded from Internet address http://richardhartersworld.com/slidingmin/ on Aug. 5, 2022, 4 pages.

scipy.ndimage.maximum_filter, SciPy.org, SciPy v1.9.0 Manual, downloaded from Internet address https://docs.scipy.org/doc/scipy/reference/generated/scipy.ndimage.maximum_filter.html on Aug. 5, 2022, 3 pages.

scipy.ndimage.maximum_filter1d, SciPy.org, SciPy v1.9.0 Manual, downloaded from Internet address https://docs.scipy.org/doc/scipy/reference/generated/scipy.ndimage.maximum_filter1d.html on Aug. 5, 2022, 3 pages.

scipy.ndimage.filters.maximum_filter, SciPy.org, SciPy v0.14.0 Reference Guide, downloaded from Internet address https://docs.scipy.org/doc/scipy-0.14.0/reference/generated/scipy.ndimage.filters.maximum_filter.html on Aug. 5, 2022, 2 pages.

Multidimensional image processing, SciPy.org, SciPy v1.9.0 Manual, downloaded from Internet address https://docs.scipy.org/doc/scipy/tutorial/ndimage.html on Aug. 5, 2022, 27 pages.

Kim Hyoung-Gook et al., Robust audio fingerprinting using peak-pair-based hash of non-repeating foreground audio in a real. environment, Cluster Computing, Baltzer Science Publishers, Bussum, NL, vol. 19, No. 1, Jan. 2, 2016, pp. 315-323.

Notification of Transmittal of the International Search Report and the Written Opinion of the International Searching Authority, International Search Report and Written Opinion of the International Searching Authority from PCT/US2023/023731, dated Sep. 14, 2023, 14 pages.

Multidimensional image processing, SciPy.org, SciPy v0.14.0 Reference Guide, downloaded from Internet address https://docs.scipy.org/doc/scipy-0.14.0/reference/tutorial/ndimage.html on Aug. 16, 2022, 28 pages.

Will Drevo, Audio Fingerprinting with Python and Numpy, Nov. 15, 2013, downloaded from Internet address https://willdrevo.com/fingerprinting-and-audio-recognition-with-python/ on Aug. 8, 2022, 15 pages.

* cited by examiner

400

500

502

| 93 | 34 | 39 | 34 | 21 | 59 | 85 | 57 | 54 | 61 |
|----|----|----|----|----|----|----|----|----|----|
| 62 | 72 | 41 | 16 | 52 | 50 | 62 | 82 | 99 | 17 |
| 54 | 73 | 15 | 6 | 51 | 64 | 90 | 63 | 91 | 72 |
| 37 | 37 | 59 | 28 | 71 | 80 | 87 | 56 | 90 | 41 |
| 70 | 52 | 65 | 11 | 69 | 17 | 61 | 83 | 51 | 12 |
| 0 | 6 | 38 | 67 | 64 | 89 | 32 | 54 | 4 | 75 |
| 79 | 41 | 12 | 38 | 69 | 36 | 70 | 56 | 44 | 60 |
| 49 | 14 | 65 | 14 | 26 | 86 | 83 | 39 | 69 | 35 |
| 52 | 21 | 93 | 90 | 89 | 9 | 31 | 73 | 64 | 35 |
| 48 | 95 | 77 | 13 | 33 | 98 | 49 | 55 | 55 | 93 |

504

508

506

| 1 | 0 | 0 | 0 | 0 | 0 | 0 | 0 | 0 | 0 |
|---|---|---|---|---|---|---|---|---|---|
| 0 | 0 | 0 | 0 | 0 | 0 | 0 | 0 | 1 | 0 |
| 0 | 0 | 0 | 0 | 0 | 0 | 0 | 0 | 0 | 0 |
| 0 | 0 | 0 | 0 | 0 | 0 | 0 | 0 | 0 | 0 |
| 0 | 0 | 0 | 0 | 0 | 0 | 0 | 0 | 0 | 0 |
| 0 | 0 | 0 | 0 | 0 | 1 | 0 | 0 | 0 | 0 |
| 0 | 0 | 0 | 0 | 0 | 0 | 0 | 0 | 0 | 0 |
| 0 | 0 | 0 | 0 | 0 | 0 | 0 | 0 | 0 | 0 |
| 0 | 0 | 0 | 0 | 0 | 0 | 0 | 0 | 0 | 0 |
| 0 | 1 | 0 | 0 | 0 | 1 | 0 | 0 | 0 | 1 |

| INDEX | FREQUENCY (QUANTIZED VALUE 0-255) | TIME SEGMENT OFFSET |
|-------|-----------------------------------|---------------------|
| 1 | 89 | 30 |
| 2 | 140 | 30 |
| 3 | 192 | 30 |
| 4 | 72 | 35 |
| 5 | 76 | 36 |
| 6 | 106 | 36 |
| 7 | 192 | 36 |
| 8 | 106 | 39 |

| BASE TUPLE | FINGERPRINT TUPLE - OFFSET: (FREQUENCY 1, FREQUENCY 2, DELTA T) | PEAKS COMPARED INDICES |
|---|---|---|
| (89, 30) | 30: (89, 140, 0) | 1, 2 |
| (89, 30) | 30: (89, 192, 0) | 1, 3 |
| (89, 30) | 30: (89, 72, 5) | 1, 4 |
| (89,30) | 30: (89, 76, 6) | 1,5 |
| (140, 30) | 30: (140, 192, 0) | 2, 3 |
| (140,30) | 30: (140, 72, 5) | 2, 4 |
| (140, 30) | 30: (140, 76, 6) | 2, 5 |
| (140,30) | 30: (140, 106, 6) | 2, 6 |
| (192, 30) | 30: (192, 72, 5) | 3, 4 |
| (192, 30) | 30: (192, 76, 6) | 3, 5 |
| (192, 30) | 30: (192, 106, 6) | 3, 6 |
| (192, 30) | 30: (192, 192, 6) | 3, 7 |
| (72, 35) | 35: (72, 76, 1) | 4, 5 |
| (72, 35) | 35: (72, 106, 1) | 4, 6 |
| (72,35) | 35: (72, 192, 1) | 4, 7 |
| (72,35) | 35: (72, 106, 4) | 4, 8 |
| (76,36) | 36: (76, 106, 0) | 5, 6 |
| (76,36) | 36: (76, 192, 0) | 5, 7 |
| (76,36) | 36: (76, 106, 3) | 5, 8 |
| (106, 36) | 36: (106, 192, 0) | 6, 7 |
| (106, 36) | 36: (106, 106, 3) | 6, 8 |

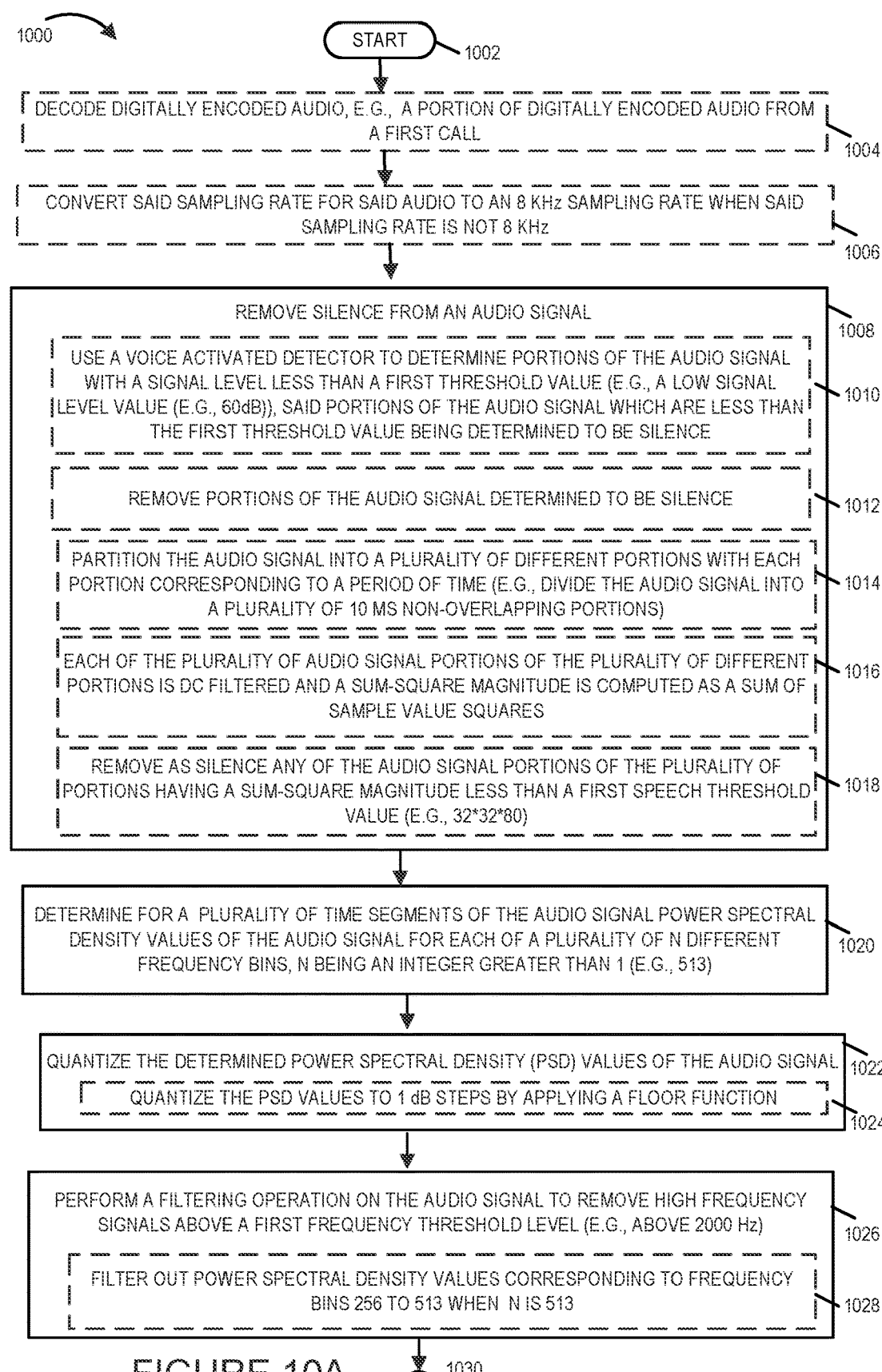

1000

START 1002

DECODE DIGITALLY ENCODED AUDIO, E.G., A PORTION OF DIGITALLY ENCODED AUDIO FROM A FIRST CALL 1004

CONVERT SAID SAMPLING RATE FOR SAID AUDIO TO AN 8 KHz SAMPLING RATE WHEN SAID SAMPLING RATE IS NOT 8 KHz 1006

REMOVE SILENCE FROM AN AUDIO SIGNAL 1008

USE A VOICE ACTIVATED DETECTOR TO DETERMINE PORTIONS OF THE AUDIO SIGNAL WITH A SIGNAL LEVEL LESS THAN A FIRST THRESHOLD VALUE (E.G., A LOW SIGNAL LEVEL VALUE (E.G., 60dB)), SAID PORTIONS OF THE AUDIO SIGNAL WHICH ARE LESS THAN THE FIRST THRESHOLD VALUE BEING DETERMINED TO BE SILENCE 1010

REMOVE PORTIONS OF THE AUDIO SIGNAL DETERMINED TO BE SILENCE 1012

PARTITION THE AUDIO SIGNAL INTO A PLURALITY OF DIFFERENT PORTIONS WITH EACH PORTION CORRESPONDING TO A PERIOD OF TIME (E.G., DIVIDE THE AUDIO SIGNAL INTO A PLURALITY OF 10 MS NON-OVERLAPPING PORTIONS) 1014

EACH OF THE PLURALITY OF AUDIO SIGNAL PORTIONS OF THE PLURALITY OF DIFFERENT PORTIONS IS DC FILTERED AND A SUM-SQUARE MAGNITUDE IS COMPUTED AS A SUM OF SAMPLE VALUE SQUARES 1016

REMOVE AS SILENCE ANY OF THE AUDIO SIGNAL PORTIONS OF THE PLURALITY OF PORTIONS HAVING A SUM-SQUARE MAGNITUDE LESS THAN A FIRST SPEECH THRESHOLD VALUE (E.G., 32*32*80) 1018

DETERMINE FOR A PLURALITY OF TIME SEGMENTS OF THE AUDIO SIGNAL POWER SPECTRAL DENSITY VALUES OF THE AUDIO SIGNAL FOR EACH OF A PLURALITY OF N DIFFERENT FREQUENCY BINS, N BEING AN INTEGER GREATER THAN 1 (E.G., 513) 1020

QUANTIZE THE DETERMINED POWER SPECTRAL DENSITY (PSD) VALUES OF THE AUDIO SIGNAL 1022

QUANTIZE THE PSD VALUES TO 1 dB STEPS BY APPLYING A FLOOR FUNCTION 1024

PERFORM A FILTERING OPERATION ON THE AUDIO SIGNAL TO REMOVE HIGH FREQUENCY SIGNALS ABOVE A FIRST FREQUENCY THRESHOLD LEVEL (E.G., ABOVE 2000 Hz) 1026

FILTER OUT POWER SPECTRAL DENSITY VALUES CORRESPONDING TO FREQUENCY BINS 256 TO 513 WHEN N IS 513 1028

FIGURE 10A    A 1030

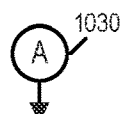
1030

IDENTIFY (i) A PLURALITY OF DOMINANT FREQUENCY PEAKS BASED ON THE DETERMINED POWER SPECTRAL DENSITY VALUES, AND (ii) POSITIONS IN THE AUDIO SIGNAL CORRESPONDING TO THE IDENTIFIED PEAKS  ⌐ 1032

IDENTIFY FOR EACH OF THE PLURALITY OF TIME SEGMENTS OF THE AUDIO SIGNAL A SET OF FREQUENCY BINS WITH THE HIGHEST POWER SPECTRAL DENSITY VALUES ABOVE A FIRST THRESHOLD VALUE, THE SET OF FREQUENCY BINS HAVING M OR FEWER ENTRIES, WHERE M IS LESS THAN N, AND WHERE M IS AN INTEGER (E.G., N=513 and M=4)  ⌐ 1034

GENERATE A SPECTROGRAM OF POWER SPECTRAL DENSITY VALUES BASED ON: (i) THE DETERMINED POWER SPECTRAL DENSITY VALUES OF THE AUDIO SIGNAL, (ii) THE SET OF FREQUENCY BINS, AND (iii) THE PLURALITY OF TIME SEGMENTS  ⌐ 1036

APPLY A MAXIMAL FILTER TO SAID SPECTROGRAM OF POWER SPECTRAL DENSITY VALUES TO LOCATE FREQUENCY PEAKS IN THE SPECTROGRAM  ⌐ 1038

APPLY AN EROSION FILTER TO SAID SPECTROGRAM OF POWER SPECTRAL DENSITY VALUES AFTER APPLYING SAID MAXIMAL FILTER  ⌐ 1040

GENERATE A FIRST AUDIO FINGERPRINT FROM AT LEAST SOME OF THE IDENTIFIED PLURALITY OF DOMINANT FREQUENCY PEAKS AND THE IDENTIFIED POSITIONS IN THE AUDIO SIGNAL CORRESPONDING TO THE IDENTIFIED PEAKS  ⌐ 1042

GENERATE THE FIRST AUDIO FINGERPRINT, SAID FIRST AUDIO FINGERPRINT INCLUDING AN ORDERED SET OF INFORMATION, SAID ORDERED SET OF INFORMATION INCLUDING A FIRST TIME, A FIRST FREQUENCY BIN, A SECOND FREQUENCY BIN AND A DELTA TIME,

THE FIRST FREQUENCY BIN VALUE CORRESPONDING TO A FIRST DOMINANT FREQUENCY PEAK, THE FIRST DOMINANT FREQUENCY PEAK BEING ONE OF THE IDENTIFIED DOMINANT FREQUENCY PEAKS;  ⌐ 1044

THE SECOND FREQUENCY BIN VALUE CORRESPONDING TO A SECOND DOMINANT FREQUENCY PEAK, THE SECOND DOMINANT FREQUENCY PEAK BEING ONE OF THE IDENTIFIED DOMINANT FREQUENCY PEAKS, THE FIRST DOMINANT FREQUENCY PEAK AND THE SECOND DOMINANT FREQUENCY PEAK BEING DIFFERENT DOMINANT FREQUENCY PEAKS;

THE FIRST TIME IS A FIRST IDENTIFIED LOCATION IN THE AUDIO SIGNAL CORRESPONDING TO THE FIRST DOMINANT FREQUENCY PEAK, THE FIRST TIME BEING A TIME CORRESPONDING TO A FIRST TIME SEGMENT OF THE PLURALITY OF TIME SEGMENTS, THE FIRST DOMINANT FREQUENCY PEAK APPEARING IN THE FIRST TIME SEGEMENT;

THE DELTA TIME IS A TIME DIFFERENCE BETWEEN A SECOND IDENTIFIED LOCATION IN THE AUDIO SIGNAL CORRESPONDING TO THE SECOND DOMINANT FREQUENCY PEAK AND THE FIRST IDENTIFIED LOCATION IN THE AUDIO SIGNAL CORRESPONDING TO THE FIRST DOMINANT FREQUENCY PEAK

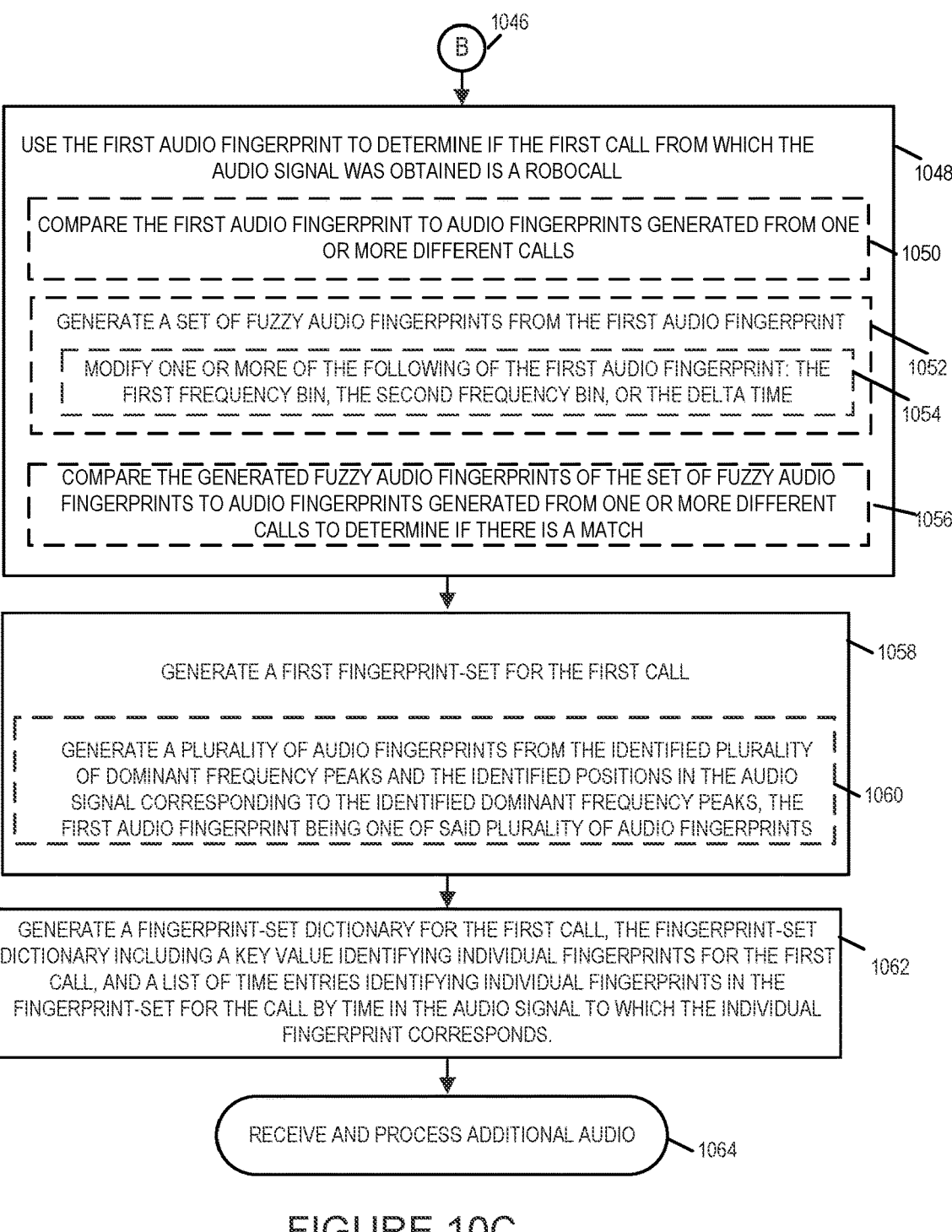

B 1046

USE THE FIRST AUDIO FINGERPRINT TO DETERMINE IF THE FIRST CALL FROM WHICH THE AUDIO SIGNAL WAS OBTAINED IS A ROBOCALL — 1048

COMPARE THE FIRST AUDIO FINGERPRINT TO AUDIO FINGERPRINTS GENERATED FROM ONE OR MORE DIFFERENT CALLS — 1050

GENERATE A SET OF FUZZY AUDIO FINGERPRINTS FROM THE FIRST AUDIO FINGERPRINT — 1052

MODIFY ONE OR MORE OF THE FOLLOWING OF THE FIRST AUDIO FINGERPRINT: THE FIRST FREQUENCY BIN, THE SECOND FREQUENCY BIN, OR THE DELTA TIME — 1054

COMPARE THE GENERATED FUZZY AUDIO FINGERPRINTS OF THE SET OF FUZZY AUDIO FINGERPRINTS TO AUDIO FINGERPRINTS GENERATED FROM ONE OR MORE DIFFERENT CALLS TO DETERMINE IF THERE IS A MATCH — 1056

GENERATE A FIRST FINGERPRINT-SET FOR THE FIRST CALL — 1058

GENERATE A PLURALITY OF AUDIO FINGERPRINTS FROM THE IDENTIFIED PLURALITY OF DOMINANT FREQUENCY PEAKS AND THE IDENTIFIED POSITIONS IN THE AUDIO SIGNAL CORRESPONDING TO THE IDENTIFIED DOMINANT FREQUENCY PEAKS, THE FIRST AUDIO FINGERPRINT BEING ONE OF SAID PLURALITY OF AUDIO FINGERPRINTS — 1060

GENERATE A FINGERPRINT-SET DICTIONARY FOR THE FIRST CALL, THE FINGERPRINT-SET DICTIONARY INCLUDING A KEY VALUE IDENTIFYING INDIVIDUAL FINGERPRINTS FOR THE FIRST CALL, AND A LIST OF TIME ENTRIES IDENTIFYING INDIVIDUAL FINGERPRINTS IN THE FINGERPRINT-SET FOR THE CALL BY TIME IN THE AUDIO SIGNAL TO WHICH THE INDIVIDUAL FINGERPRINT CORRESPONDS. — 1062

RECEIVE AND PROCESS ADDITIONAL AUDIO — 1064

FIGURE 10C

| FIGURE 10A |
| FIGURE 10B |
| FIGURE 10C |

FIGURE 10

METHODS AND APPARATUS FOR GENERATING AUDIO FINGERPRINTS FOR CALLS USING POWER SPECTRAL DENSITY VALUES

RELATED APPLICATIONS

The present application claims the benefit of U.S. Provisional Patent Application Ser. No. 63/346,989 which was filed on May 30, 2022 and which is hereby expressly incorporated by reference in its entirety.

FIELD OF INVENTION

The present invention relates to methods, systems and apparatus for generating and/or using communications media fingerprints, e.g., the generation and/or use of audio fingerprints to detect SPAM communications such as robocalls.

BACKGROUND

Robocalling campaigns consist of an entity using automatic dialers to play substantially identical pre-recorded messages to large numbers of telephone customers. The United States Federal Communications Commission (FCC) and other regulatory entities have mandated that telephone companies detect and block such robocalling campaigns. Sometimes this can be done by inspecting metadata, such as caller identification information, for the call, however robocallers are able to change such metadata thus making such a method unreliable. Given that the media, e.g., the audio, of a call of a robocall campaign is typically the same or very similar for multiple calls of the campaign, it would be useful to use media analysis of communications, e.g., calls, in identifying robocalls.

While there are systems and algorithms such as the Dejavu algorithm for generating and using audio fingerprinting for identifying copies of music, such applications focus on features and/or details of the music content which are not particularly applicable to identifying marketing communications media, e.g., robocalls or SPAM communications, which may intentionally differ, e.g., different called party name, and/or have been degraded by the communications network by which and/or through which communications have been sent.

From the foregoing, it should be understood, that there is a need for new and/or improved methods, systems and apparatus for overcoming the technological problem of how to effectively and efficiently analyze communications, e.g., calls, for detecting SPAM communications such as for example robocalls. There is a further need for new and/or improved methods, systems, and apparatus for analyzing communications media, e.g., call media such as audio and speech, to generate and/or create a fingerprint set out of the media so that different communications, e.g., calls, with similar media have a similar fingerprint set. There is also a need for new and/or improved methods, systems, and apparatus for creating and/or generating fingerprint sets from a voice call. There is a further need for how to analyze and store information about communications including information about the media of a communication such as voice from the communication while maintaining and not violating privacy of the communicating parties. There is a further need for solving the technological problem of how to efficiently store information captured about media of a communication in way that allows for efficient retrieval and usage for matching. There is a further need for new and/or improved methods, system and/or apparatus of how to determine that speech of a communication matches and determine what degree of confidence there is in the match.

SUMMARY

The present invention is directed to various features relating to methods, systems and apparatus for generating and/or using communications media fingerprints, including communications media fuzzy fingerprints e.g., to detect and/or classify and/or assist in the detection and/or classification of communications as SPAM communications, e.g., robocalls, and/or mitigating the disruption and negative effects of SPAM communications, e.g., robocalls. One or more embodiments of the present invention addresses one or more of the various technical problems described above and herein and improves upon the efficiency, effectiveness and cost of detecting and/or classifying communications, e.g., calls, as robocalls and/or mitigating the disruption and negative impact of robocalls on customers and businesses.

Various embodiments of the present invention are directed to methods, systems and apparatus for analyzing communications, e.g., call, media and creating/generating a fingerprint-set out of the media analysis so that different communications, e.g., calls, with similar media shall have a similar fingerprint-set.

Various embodiments of the present invention are directed to generating and/or creating and/or matching fuzzy fingerprints of communications media.

Various embodiments of the present invention address issues discussed below with respect to creating and using a fingerprint-set out of communications media, e.g., voice of a call, e.g., to detect SPAM or robocall campaigns such as how to maintain privacy of a caller while still capturing information about the audio in a way that the audio can not be replicated from the stored information about the audio.

Various embodiments of the present invention address problems with how to efficiently store and retrieve information, e.g., communications media fingerprints and match such fingerprints.

An exemplary method of processing an audio signal, e.g., from a call, in accordance with an embodiment of the present invention includes the steps of removing silence from the audio signal; determining, for a plurality of time segments of the audio signal, power spectral density values of the audio signal for each of a plurality of N different frequency bins, N being an integer greater than 1; identifying (i) a plurality of dominant frequency peaks based on the determined power spectral density values, and (ii) positions in the audio signal corresponding to the identified peaks; and generating a first audio fingerprint from at least some of the identified plurality of dominant frequency peaks and the identified positions in the audio signal corresponding to the identified peaks.

In some embodiments, the first audio fingerprint is generated by an audio fingerprinting entity.

In some embodiments, the audio fingerprinting entity is a Session Border Controller; and wherein said Session Border Controller receives said audio signal as encoded audio, said first audio fingerprint being generated as said audio signal passes through said Session Border Controller.

In some embodiments, the step of identifying a plurality of dominant frequency peaks based on the determined power spectral density values includes: identifying for each of the plurality of time segments of the audio signal a set of frequency bins with the highest power spectral density values above a first threshold value, said set of frequency bins having M or fewer entries, where M is less than N, and where M is an integer (e.g., N=513 and M=4); and wherein said identified positions in the audio signal corresponding to the identified peaks are times corresponding to the time segments in which the identified peaks appear.

In some embodiments, each of said power spectral density values for a time segment is a measure of the audio signal's power content versus frequency for the time segment and frequency bin.

In some embodiments, each of said power spectral density values is an amplitude.

In various embodiments, the audio signal is a portion of a first call (e.g., voice call media).

In some embodiments, the method further includes the step of: performing, prior to said identifying (i) a plurality of dominant frequency peaks based on the determined power spectral density values and (ii) positions in the audio signal corresponding to the identified peaks, a filtering operation on the audio signal to remove high frequency signals above a first frequency threshold level (e.g., above 2000 Hz as audio signals above 2 KHz tend not to be from human telephony speech).

In some embodiments, N=513; and said step of performing a filtering operation on the audio signal to remove high frequency signals above a first frequency threshold level includes filtering out power spectral density values corresponding to frequency bins N=256 to 513.

In some embodiments, the method further includes the step of: quantizing the determined power spectral density (PSD) values of the audio signal (e.g., quantize the PSD values to 1 dB steps by applying a floor function).

In some embodiments, the step of identifying (i) a plurality of dominant frequency peaks based on the determined power spectral density values, and (ii) positions in the audio signal corresponding to the identified peaks includes: generating a spectrogram of power spectral density values based on: (i) said determined power spectral density values of the audio signal, (ii) the set of frequency bins, and the plurality of time segments; and applying a maximal filter to said spectrogram of power spectral density values to locate frequency peaks in said spectrogram.

In some embodiments, the step of identifying (i) a plurality of dominant frequency peaks based on the determined power spectral density values, and (ii) positions in the audio signal corresponding to the identified peaks further includes: applying an erosion filter to said spectrogram of power spectral density values after applying said maximal filter.

In some embodiments, the audio signal is a portion of digitally encoded audio from a first call; and wherein said method of processing said audio signal further includes prior to determining, for a plurality of time segments of the audio signal, power spectral density values of the audio signal for each of a plurality of N different frequency bins: decoding said digitally encoded audio; and converting said sampling rate for said audio to an 8 KHz sampling rate when said sampling rate is not 8 KHz.

In some embodiments, the audio signal is a digital signal that has been encoded using a telephony codec (e.g., an ITU-T G.711 A-law or Mu-law codec).

In some embodiments, the audio signal is a digital signal that has been encoded and compressed using a standards-based speech codec (e.g., an ITU-T G.729A or Adaptive Multi-Rate (AMR) codec).

In some embodiments, the method further includes the step of: using the first audio fingerprint to determine if the first call is a robocall. In some such embodiments, the step of using the first audio fingerprint to determine if the first call is a robocall includes comparing the first audio fingerprint to audio fingerprints generated from one or more different calls.

In various embodiments the step of using the first audio fingerprint to determine if the first call is a robocall includes: generating a set of fuzzy audio fingerprints from the first audio fingerprint and comparing the generated fuzzy audio fingerprints to audio fingerprints generated from one or more different calls to determine if there is a match.

In various embodiments, the first audio fingerprint is an ordered set of information including a first time, a first frequency bin, a second frequency bin, and a delta time; wherein said generating a set of fuzzy audio fingerprints from the first audio fingerprint includes modifying one or more of the following of the first audio fingerprint: the first frequency bin, the second frequency bin, or the delta time.

In some embodiments, the first audio fingerprint is an ordered set of information including a first time, a first frequency bin, a second frequency bin, and a delta time; wherein said first frequency bin value corresponds to a first dominant frequency peak, said first dominant frequency peak being one of the identified dominant frequency peaks; wherein said second frequency bin value corresponds to a second dominant frequency peak, said second dominant frequency peak being one of the identified dominant frequency peaks, said first dominant frequency peak and said second dominant frequency peak being different dominant frequency peaks; wherein said first time is a first identified location in the audio signal corresponding to the first dominant frequency peak, said first time being a time corresponding to a first time segment of the plurality of time segments, said first dominant frequency peak appearing in said first time segment; wherein said delta time is a time difference between a second identified location in the audio signal corresponding to the second dominant frequency peak and the first identified location in the audio signal corresponding to the first dominant frequency peak.

In some embodiments, the first audio fingerprint is a tuple including a first time, a first frequency bin, a second frequency bin, and a delta time; wherein said first frequency bin corresponds to a first dominant frequency peak, said first dominant frequency peak being one of the identified dominant frequency peaks; wherein said second frequency bin corresponds to a second dominant frequency peak, said second dominant frequency peak being one of the identified dominant frequency peaks, said first dominant frequency peak and said second dominant frequency peak being different dominant frequency peaks; wherein said first time is a first identified location in the audio signal corresponding to the first dominant frequency peak, said first time being a time corresponding to a first time segment of the plurality of time segments, said first dominant frequency peak appearing in said first time segment; wherein said delta time is a time difference between a second identified location in the audio signal corresponding to the second dominant frequency peak and the first identified location in the audio signal corresponding to the first dominant frequency peak.

In some embodiments, the second identified location in the audio signal corresponding to the second dominant frequency peak is a second time corresponding to a second time segment in the audio signal in which the second dominant frequency peak appears.

In various embodiments, when the first dominant frequency peak and the second dominant frequency peak are located in the same time segment, said delta time is zero.

In some embodiments, the method further includes the step of generating a first fingerprint-set for a first call, said audio signal being from said first call, said generating a first fingerprint-set for the first call including generating a plurality of audio fingerprints from the identified plurality of dominant frequency peaks and the identified positions in the audio signal corresponding to the identified peaks, said first audio fingerprint being one of said plurality of audio fingerprints.

In some embodiments, the method further includes the step of generating a fingerprint-set dictionary for the first call, said fingerprint-set dictionary including a key value identifying individual fingerprints for the first call, and a list of time entries identifying individual fingerprints in the fingerprint-set for the call by the time in the audio signal to which the individual fingerprint corresponds.

In some embodiments, the step of removing silence from the audio signal is performed using a voice activated detector (e.g., a low complexity voice activated detector).

In some embodiments, the step of removing silence from the audio signal includes: (i) using voice activation detection to determine portions of the audio signal with a signal level less than a first threshold value (e.g., a low signal level), said portions of the audio signal being less than the first threshold value being determined to be silence; and (ii) removing portions of the audio signal determined to be silence. In some such embodiments, first threshold value is 60 dB.

In some embodiments, the step of removing silence from the audio signal includes: (i) partitioning the audio signal into a plurality of different portions with each portion corresponding to a period of time (e.g., dividing the audio signal up into a plurality of 10 ms non-overlapping portions); (ii) each of the plurality of audio signal portions of the plurality of different portions is DC filtered and a sum-square magnitude is computed as a sum of sample value squares; and (iii) removing as silence any of the audio signal portions of the plurality of portions having a sum-square magnitude less than a first speech threshold value (e.g., 32*32*80).

In some embodiments, the step of removing silence from the audio signal is performed by using voice activation detection to determine portions of the audio signal with low signal strength (e.g., less than 60 dB signal level) for a duration of time equal to or greater than a first time threshold value (e.g., 10 ms).

The present invention is applicable to apparatus and system embodiments wherein one or more devices implement the steps of the method embodiments. In some system embodiments, one or more steps of the method are implemented in one or more of the following: a computing device/node, a fingerprinting entity/device, a communications processing device, network equipment, Session Border Controller, and Media Gateway. In various embodiments, these pieces of equipment and other apparatus/devices of the system include a processor and a memory, the memory including instructions that when executed by the processor control the apparatus/device of the system to operate to perform the steps of various method embodiments of the invention.

An exemplary system for processing an audio signal in accordance with an embodiment of the present invention includes: an audio fingerprinting device including a first processor, said first processor controlling the audio fingerprint device to perform the following operations: removing silence from the audio signal; determining, for a plurality of time segments of the audio signal, power spectral density values of the audio signal for each of a plurality of N different frequency bins, N being an integer greater than 1 (e.g., 513); identifying (i) a plurality of dominant frequency peaks based on the determined power spectral density values, and (ii) positions in the audio signal corresponding to the identified peaks; and generating a first audio fingerprint from at least some of the identified plurality of dominant frequency peaks and the identified positions in the audio signal corresponding to the identified peaks.

In some system embodiments, the audio fingerprinting device is a communications processing device.

In some system embodiments, the audio fingerprinting device is a Session Border Controller; and the Session Border Controller receives said audio signal as encoded audio, said first audio fingerprint being generated as said audio signal passes through said Session Border Controller.

While various embodiments have been discussed in the summary above, it should be appreciated that not necessarily all embodiments include the same features and some of the features described above are not necessary but can be desirable in some embodiments. Numerous additional features, embodiments and benefits of various embodiments are discussed in the detailed description which follows.

BRIEF DESCRIPTION OF THE DRAWINGS

FIG. 5 illustrates an example of a maximal filter applied with a 5×5 window for a 10×10 matrix

FIG. 7 illustrates a table including a sorted list of quantized frequency values or frequency bins peaks and their location in an audio signal expressed as a time segment offset.

FIG. 8 illustrates a table of fingerprint tuples with information showing the base tuple and the frequency peaks compared to form each of the fingerprint tuples included in the table.

FIG. 10A illustrates the first part of an exemplary method in accordance with an embodiment of the present invention.

FIG. 10B illustrates the second part of an exemplary method in accordance with an embodiment of the present invention.

FIG. 10C illustrates the third part an exemplary method in accordance with an embodiment of the present invention.

FIG. 10 comprises the combination of FIGS. 10A, 10B, and 10C.

DETAILED DESCRIPTION

The present invention utilizes procedures including generating and using media, e.g., audio, fingerprint matching of communications media, e.g., audio speech, to detect and/or aid in the detection of communications of a first type, e.g., unsolicited communications such as robocalls.

Figure 1:
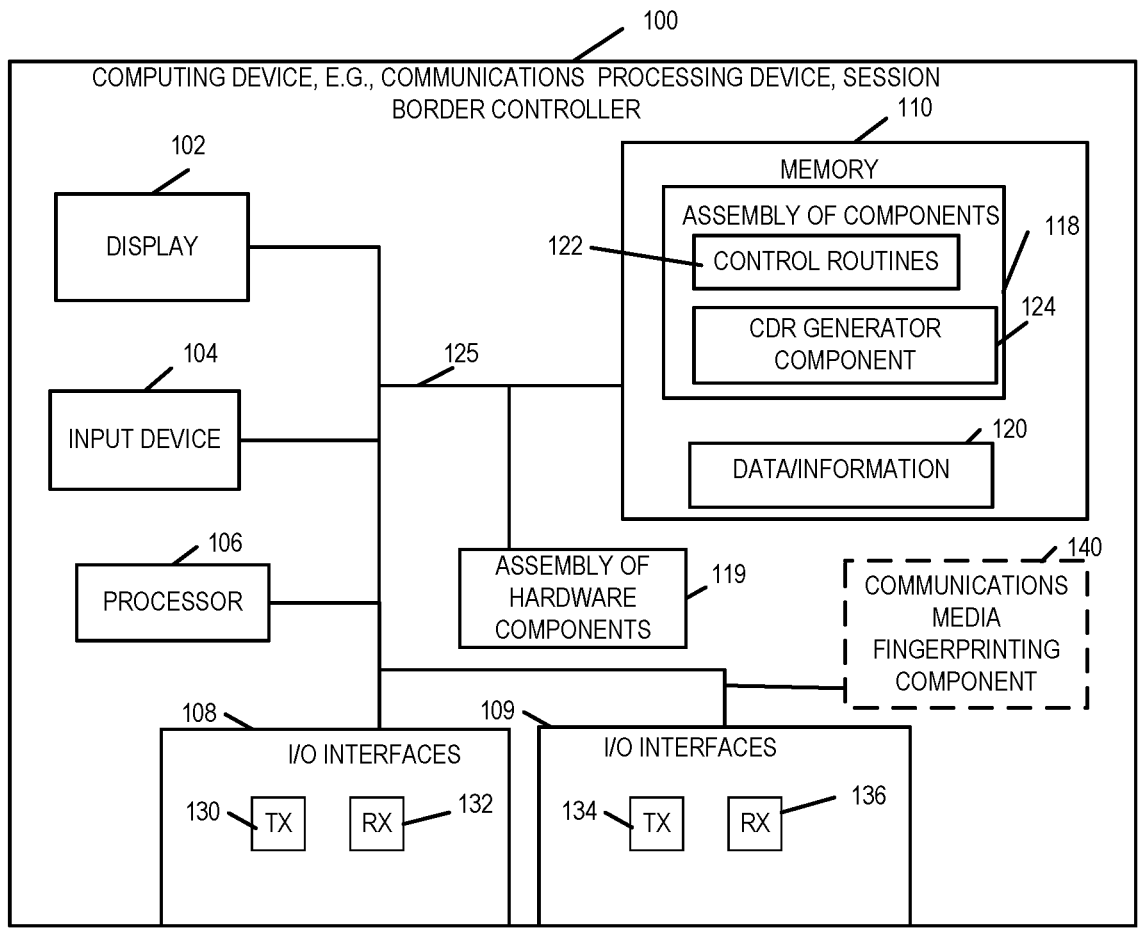
FIG. 1 illustrates an exemplary computing device, e.g., a communications processing device such as a Session Border Controller, in accordance with an embodiment of the present invention.

FIG. 1 illustrates an exemplary computing device/node 100, e.g., a communications processing device such as a Session Border Controller (SBC), that performs among other things communications, e.g., call, media fingerprinting and analysis. For the sake of simplicity, the computing device 100 also sometimes referred to herein as communications processing device 100 is explained using an exemplary embodiment where the computing device 100 is a Session Border Controller (SBC). However, it should be understood that the invention is not limited to the computing device of the invention being an SBC. For example, the computing device 100 can and in some embodiments is a media gateway or telecommunications/network switching equipment. Exemplary computing device 100 includes an optional display 102, an input device 104, a processor 106, e.g., a CPU, I/O interfaces 108 and 109, which couple the communications processing device 100 to networks or communications links and/or various other devices, memory 110, and an assembly of hardware components 119, e.g., circuits corresponding to different components and/or modules, and a communications media fingerprinting component 140 coupled together via a bus 125 over which the various elements may interchange data and information. In some embodiments, the communications media fingerprinting component is implemented as a software component or module or a hardware component or a combination of software and hardware components. Memory 110 includes an assembly of components 118, e.g., an assembly of software components, and data/information 120. The assembly of software components 118 includes a control routines component 122 which includes software instructions which when processed and executed by processor 106 control the operation of the computing device 100 to perform various functions and/or one or more steps of the various method embodiments of the invention. The assembly of components also includes a communications detail record generator component 124 which generates communications detail records from information corresponding to communications, e.g., VOIP calls, passing through, established by and/or monitored by the Session Border Controller 100. The I/O interface 108 includes transmitters 130 and receivers 132. The I/O interface 109 includes transmitters 134 and receivers 136. The I/O interfaces are hardware interfaces including hardware circuitry. The computing device is also configured to have a plurality of Internet Protocol (IP) address/port number pairs, e.g., logical IP address/port pairs, for use in exchanging signaling information. In some embodiments the I/O interfaces include IP address/port pairs. The I/O interfaces in some embodiments are configured to communicate in accordance with the IP, Transport Control Protocol (TCP), User Datagram Protocol (UDP), Session Initiation Protocol (SIP), Session Description Protocol (SDP), Real-time Transport Protocol (RTP), and RTP Control Protocol (RTCP). In some embodiments, the SBC device 100 includes a communication component configured to operate using IP, TCP, UDP, SDP and SIP protocol signaling methods. One or more of the I/O interfaces also support public switched telephone network and Integrated Services Digital Network (ISDN) connections and protocols such as for example, T1/E1 connections, BRI connections, ISDN protocol, etc. In some embodiments, the communications component is a hardware component, a software component or a component including hardware and software components. The communications media fingerprinting component is used to generate and analyze media, e.g., digital audio of a voice call, received by the computing device 100.

Figure 11:
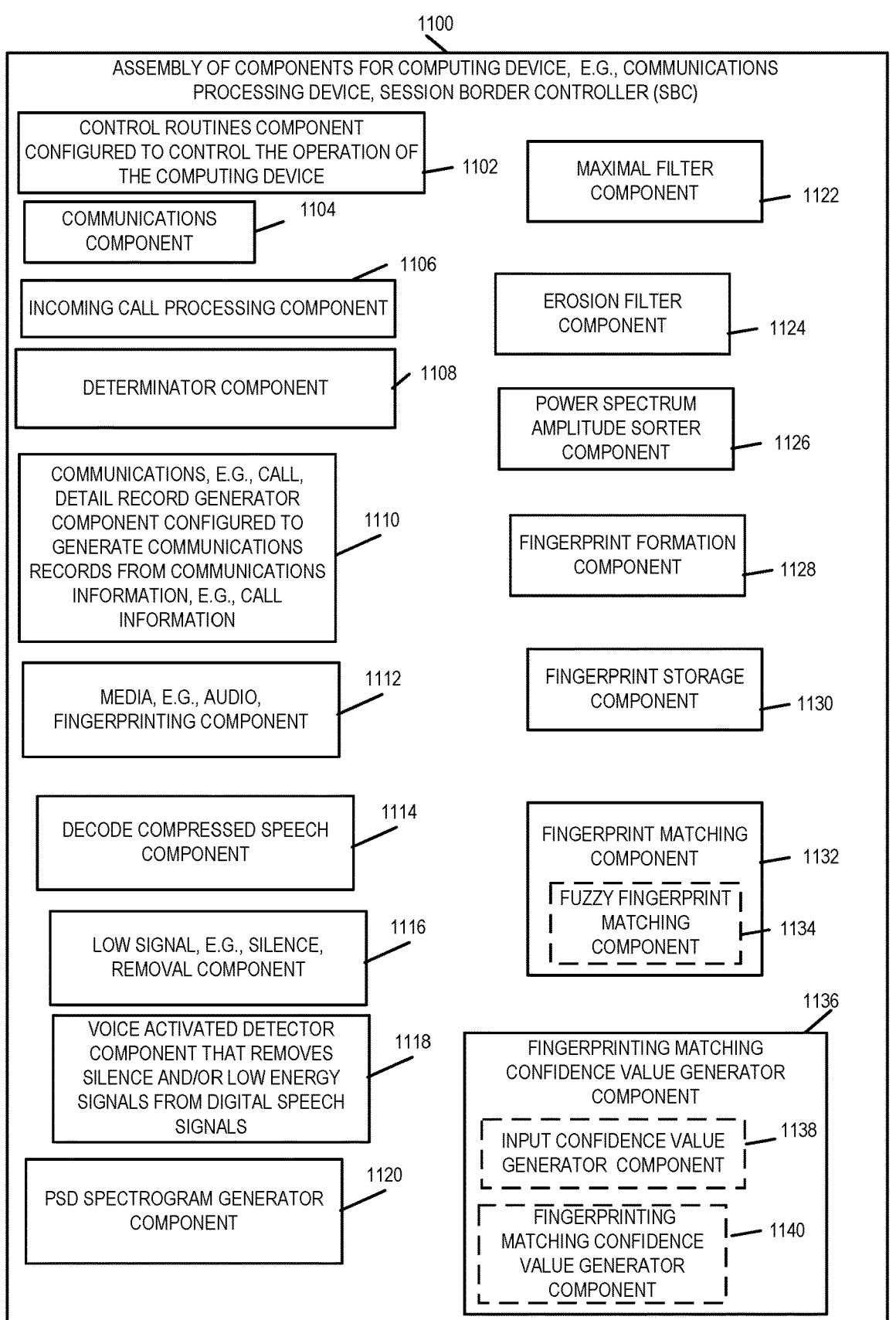
FIG. 11 illustrates an exemplary assembly of components for a computing device, e.g., a communications processing device, a Session Border Controller, a network equipment device, in accordance with an embodiment of the present invention

An exemplary assembly of components 1100 for a communications processing device in accordance with an embodiment of the present invention is illustrated in FIG. 11. One or more of the assembly of components may be implemented as hardware components in the assembly of hardware components 119 or as software components in the assembly of software components 118 stored in memory 110 of the exemplary computing device 100. The assembly of components 1100 will be discussed in further detail below.

In various embodiments the present invention applies media processing to communications media, e.g., telephone call media such as audio, to aid in the detection and classification of unsolicited communications, e.g., unsolicited telephone calls, generally known as SPAM calls. In various embodiments the present invention also includes the generation and/or use of audio fingerprinting which is applied to media in a network entity or device, e.g., media gateway or Session Border Controller (SBC), and is applicable to media, e.g., audio, encoded using basic telephony codecs such as ITU-T G.711 A-law or Mu-law as well as media, e.g., audio, that has been compressed using standards-based codecs such as ITU-T G.729A or AMR.

Various embodiments of the present invention include analyzing communications media, e.g., call media such as audio, and generating and/or creating a fingerprint-set from the media analysis so that different communications, e.g., calls, with similar media have a similar fingerprint-set. The generated fingerprint set takes into account one or more of the following: (i) that the media available for analysis may be, and in some embodiments is, compressed using speech codecs such as G.711, G729, AMR, etc., (ii) communications media, e.g., call media or audio, may and typically does have a varying initial silence or low level noise before SPAM communications media, e.g., call media, presents itself, and (iii) the fingerprint-set should have a property that intelligible speech of the communication, e.g., call, is not recoverable from the fingerprints in the set, so as to maintain privacy of the communication, e.g., the call, (iv) the size of the fingerprint-sets needed should be minimized so that the amount of per communication data size (e.g., call data size) is small, and (v) communications, e.g., calls, can be matched for similarity based on the fingerprint-sets. In an exemplary embodiment, the generated communications media fingerprints are used to detect an evolving SPAM campaign. Fingerprints of similar SPAM communications, e.g., SPAM calls, will have matching fingerprints and therefore can be clustered and identified as a SPAM campaign.

Figure 2:
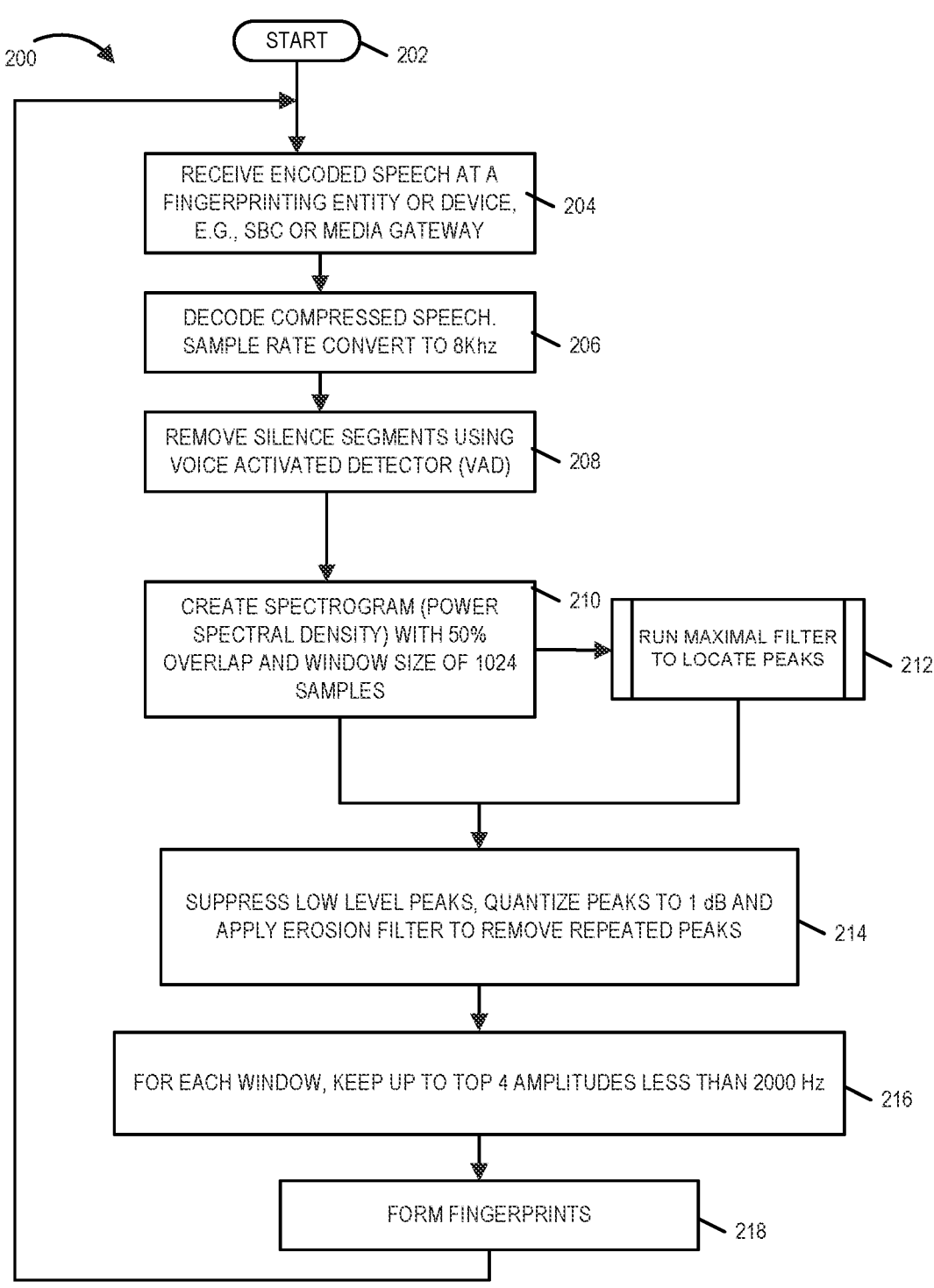
FIG. 2 illustrates a flowchart of an exemplary method in accordance with an embodiment of the present invention.

FIG. 2 illustrates a flowchart of an exemplary method 200 in accordance with an embodiment of the present invention. The method 200 describes an exemplary method for generating or creating a fingerprint-set from the media of a voice call, e.g., the audio of a voice call. The flowchart indicates various steps of the method. The input for the fingerprinting method is the media of a voice call, e.g., the telephony speech media of a call. In this example, a fingerprint is defined as including a tuple of shape (timestamp, frequency 1, frequency 2, delta timestamp); frequencies are dominant or peak frequencies observed in speech, and timestamp refers to the relative time offset where these frequency peaks are observed. The fingerprinting method 200 operates on a speech media sequence or file and generates, creates or produces a fingerprint-set including a collection of individual fingerprints. In some embodiments, the fingerprint method 200 operates on a speech media sequence or file and generates, creates or produces a fingerprint-set consisting essentially of a collection of individual fingerprints. In some embodiments, the fingerprint method 200 operates on a speech media sequence or file and generates, creates or produces a fingerprint-set consisting of a collection of individual fingerprints.

The method 200 starts in start step 202. Operation proceeds from step 202 to step 204.

In step 204, a fingerprinting entity or device such as a computing device or node 100 (e.g., a communications processing device or network equipment device such as an SBC) receives encoded speech from a telephone call. The encoded speech being the voice call media or audio of the voice call, and may, and sometimes does, include noise and/or distortion due to encoding scheme.

In various embodiments, a network equipment device includes a fingerprinting entity and/or device such as for example a fingerprinting component, module and/or application in which case the encoded speech is transferred to the fingerprinting component, module and/or application of the network equipment device for processing. In some other embodiments, a communications processing device, such as a Session Border Controller (SBC) or media gateway, communicates the encoded speech to a fingerprinting entity and/or device which is separate from the network equipment device which initially receives the encoded speech for processing. The processing described below is the same whether the fingerprinting entity is the network equipment device or a separate entity or device. Operation proceeds from step 204 to step 206.

In step 206, the fingerprinting entity, e.g., the network equipment device, decodes the compressed speech. Sample rate is converted to 8 KHz. In step 206, a digital speech signal with an 8 KHz sample rate is generated from the received encoded speech. Operation proceeds form step 26 to step 208.

In step 208, a voice activity detector, e.g., voice activity detector 1118 of system 100, removes the silence segments from the 8 KHz speech signal generating a silence removed speech signal. In some embodiments, a silence suppression entity or device is used in place of a voice activity detector to remove silence segments from the 8 KHz speech signal to generate the silence removed speech signal.

Silence Removal with Voice Activated Detector

In some embodiments, step 208 is implemented using one or more of the following sub-steps: (1) Each 10 ms segment of speech is DC filtered and sum-square magnitude is computed as sum of sample value squares. (2) A segment less than (32*32*80) is removed as silence. This is approximately 60 dB signal level.

For example, if x[i] represents sequence of values of speech samples, then:

$$DC \text{ filter value } y[i]=x[i]-\text{avg}(x)$$

$$\text{sumSquareMag}=\text{sum}(y[i]*y[i])$$

Operation proceeds from step 208 to step 210.

Spectrogram Creation

Figure 3:
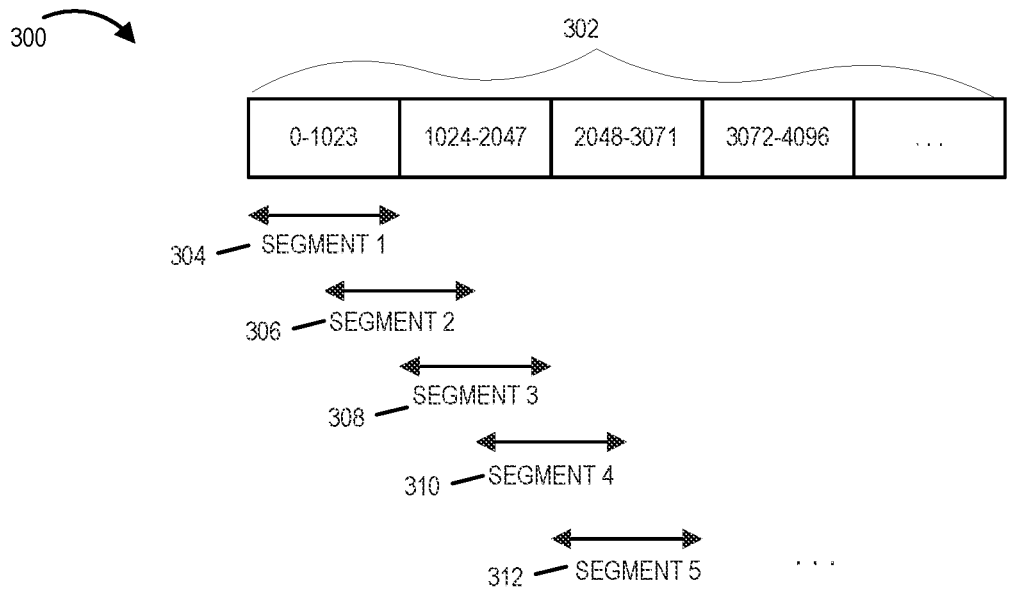
FIG. 3 illustrates a window size of 1024 samples with 50% overlap for each segment with five segments being shown (segment 1, segment 2, segment3, segment 4, and segment 5).

In step 210, the fingerprinting entity or device creates a spectrogram (power spectral density) with 50% overlap and a window size of 1024 samples from the silence removed speech signal. A 1024 point Fast Fourier Transform (FFT) is performed on sliding windows of speech signal with 50% overlap. Diagram 300 of FIG. 3 illustrates audio data 302 with a window size of 1024 samples with 50% overlap for each segment with five segments being shown (segment 1 304, segment 2 306, segment 3 308, segment 4 310, and segment 5 312). In some embodiments, the spectrogram is implemented using one or more of the following procedures. First, for each segment, power spectral density (PSD) is computed. Second, a spectrogram is then a two dimensional array, columns of which are computed using the following sub-steps: i) a Hanning window is applied to the signal, (ii) a Fast Fourier Transform (FFT) is computed, which is a set of complex values, (iii) 10*log 10 square magnitude is computed for FFT values, which is the power spectral density at specific frequency bins. Each segment thus generates 513 points of PSD and these are stored as column-wise matrix. Third, PSD values are then quantized to 1 dB steps by applying a floor( ) function.

Only dominant values of the PSD are retained by forcing PSD values below 40 to a low value of −72. Fingerprint computation is based on frequency peaks in the spectrogram, and peak contribution from low levels is due to undesirable noise represented by low PSD values.

Figure 4:
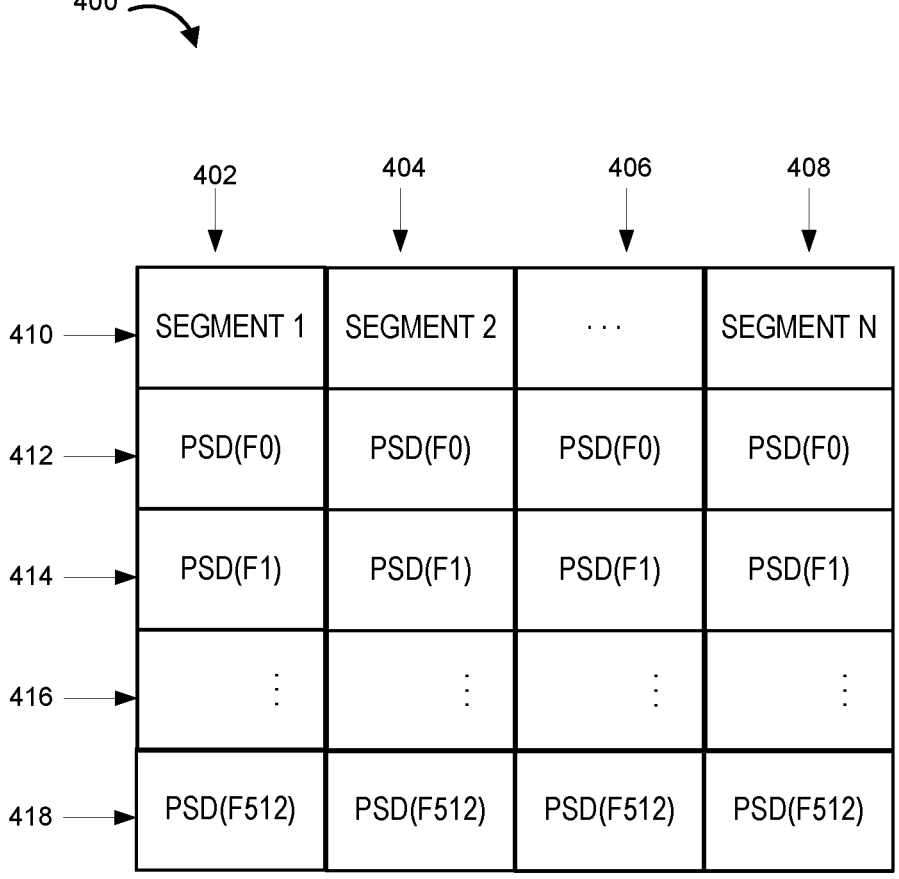
FIG. 4 illustrates an exemplary Power Spectral Density Spectrogram shown as a two dimensional array in accordance with an embodiment of the present invention.

The spectrogram consists of PSD values in specific frequency and time bins and may be viewed and/or represented as a two dimensional matrix of PSD values. FIG. 4 illustrates an exemplary two dimensional matrix with PSD values for segments 1, . . . , segment N. Table 400 of FIG. 4 illustrates an exemplary Power Spectral Density Spectrogram shown as a two dimensional array in accordance with an embodiment of the present invention.

Each of columns represents a time of the segment for which the PSDs values in the column were computed. Each segment has 513 points of PSD F0, F1, . . . , F512 which correspond to specific frequencies/frequency bins with the PSD values being included in rows corresponding to the time segment. For example, column 402 corresponds to the segment 1. Column 404 corresponds to segment 2. The . . . in column 406 indicates additional columns corresponding to segments 3 . . . N−1 which are not shown. Column 408 corresponds to segment N. The entries in row 410 are labels identifying the information contained in each column. The rows 412, 414, 416, and 418 correspond to PSD values for the respective column/time segment. For example, the entry in column 402, row 412 is the PSD value for point and/or frequency bin F0. The entry in column 402, row 418 is the PSD value for point and/or frequency bin F 512. The . . . in row 416 entries indicates that additional PSD values are included in the table. The generated PSD spectrogram is typically stored in memory. Operation proceeds from step 210 to steps 212 and 214.

Maximal Filter

In step 212, a maximal filter is used on the PSD spectrogram to create a second spectrogram showing the peaks. The PSD spectrogram data from step 210 consists of PSD values in specific frequency and time bins and may be viewed and/or represented as a two dimensional matrix of PSD values as discussed above.

In step 212, a maximal filter is used to identify salient peaks in the speech signal. The way this is achieved is by identifying the largest PSD value in a square window. The window used in this exemplary method 200 is 21×21. While different window sizes can be used experimentation has demonstrated that a window of 21×21 provides good results. The filtering operation is first performed on each row and then on each column. Maximal filter copies the largest value to all values in a filter size. After such filtering is completed, original spectrogram is then compared to the filtered result and a new Boolean matrix is created with a value of 1 when the filtered result is the same as original PSD and that of a 0 when its not. This way, the Boolean matrix peaks indicate locations of local maxima in the spectrogram. This may be implemented as:

Peak location=1 if Spectrogram value is equal to filtered value.

Peak location=0 if Spectrogram value is not equal to filtered value.

Diagram 500 of FIG. 5 illustrates an example of a maximal filter applied with a 5×5 window 504, for a 10×10 matrix 502. The smaller size window and matrix have been used to demonstrate the example for explanatory purposes. A Boolean peaks matrix 506 is generated as a result of maximal filter operation, a value of 1 in this matrix indicates that this position in the spectrogram is a local maximum after maximal filtering. Fingerprint-set formation then uses both the spectrogram with PSD values and the Boolean matrix indicating local peaks. In essence, if the window is centered on a value in the PSD matrix, and that value is the largest in the window, then that location in the Boolean matrix is a "1", otherwise it is a "0". The generated boolean peaks matrix is typically stored in memory for future reference. In the example window 504 is centered on the PSD value 89 which is the largest value in the 5×5 window 504. As a result a 1 is placed in the 10×10 Boolean matrix 506 as illustrated by arrow 508. Operation proceeds from step 212 to step 214.

Erosion Filter

In step 214, the fingerprinting entity suppresses low level peaks, quantize peaks to 1 dB and applies an erosion filter to remove repeated peaks.

Figure 6:
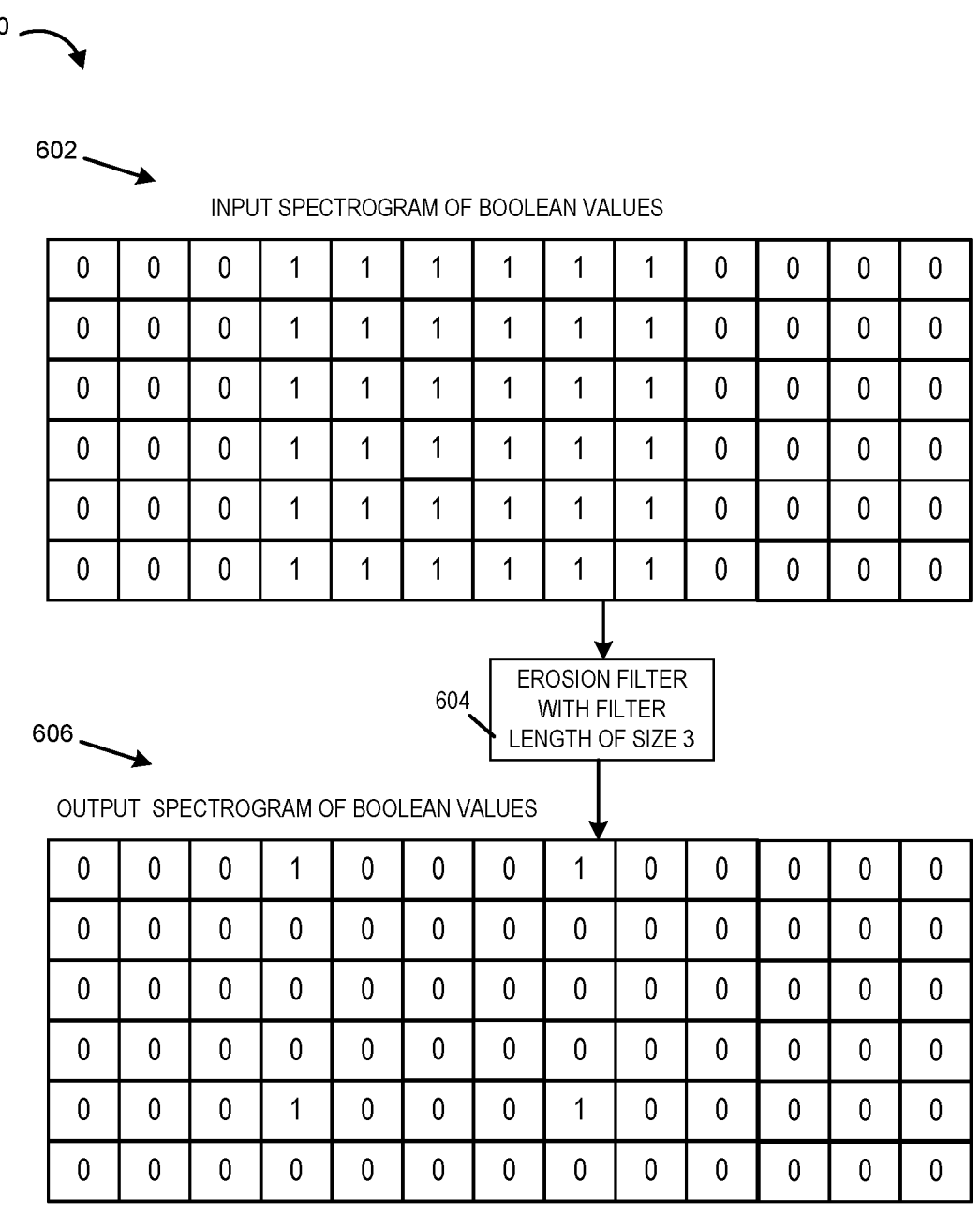
FIG. 6 illustrates an erosion filter with a filter length of 3 operated on an input matrix spectrogram to generate the illustrated output matrix.

The result of the maximal filter can sometimes give too many peaks in cases where those peaks are identical values. Identical values are more likely due to quantization of PSD to 1 dB. For example, due to quantization of values to 1 dB, a single tone can generate a peak corresponding to a tone frequency for each segment. This type of clutter of peaks is removed using an erosion filter. In the exemplary method 200, an erosion filter with a filter length of size 10 is implemented. Diagram 600 of FIG. 6 illustrates an erosion filter 604 with a filter length of size 3 operated on an input matrix spectrogram 602 of boolean values to generate the illustrated output matrix of boolean values 606. For the sake of simplicity in explaining how an erosion filter is implemented, the erosion filter algorithm in diagram 600 uses a filter length of 3 and retains only every fourth peak in cases where there are consecutive Boolean values of 1 for corresponding peaks in the spectrogram. Each row of the input matrix and output matrix represents a different frequency/frequency bin F0, F1, F2, F3, F4, and F5. Each column represents a different segment of time, i.e., time segment 1, time segment 2, time segment 3, time segment 4, time segment 5, time segment 6, time segment 7, time segment 8, time segment 9, time segment 10, time segment 10, time segment 11, time segment 12, time segment 13.

In the spectrogram of the method 200 there are 513 frequencies and N time segments. See exemplary spectrogram matrix 400 of FIG. 4.

Sort by Power Spectrum Amplitude

Each speech segment produces 513 PSD values. After maximal filtering and erosion filtering, the result is a matrix of Boolean values indicating the position of local peaks. Rows for this matrix indicate frequencies/frequency bins where the peaks occur and columns indicate time in the units of segments. This matrix of boolean values is then used to identify the PSD peak locations in the original PSD matrix. In an embodiment, this occurs by performing a boolean AND operation on the original PSD spectrogram matrix and the maximal filtered and erosion filtered spectrogram boolean matrix. Each segment is of 512 samples corresponding to 64 milliseconds (ms) of time.

Operation proceeds from step 214 to step 216. In step 216, peaks beyond 256 row value correspond to frequencies/frequency bins above 2000 Hz and are dropped from consideration as they are not from dominant voiced speech.

The rest of the peak locations are sorted by PSD amplitude and up to top (highest/largest) 4 values of frequency/frequency bin locations are saved in case there are more than 4 peak locations in each column. A partial sort algorithm is used to find up to the 4 largest PSD values and their corresponding locations. Due to the small size arrays a partial sort method is efficient as it results in a small number of swaps. After this sort, a sorted list of tuples of (frequency, time) is computed, each element in the list indicates a place where a peak was found based on the spectral analysis. Frequency in the (frequency, time) tuple is the frequency bin or frequency quantized value which is between 0 and 255, i.e., F0 to F255 in the spectrogram.

Fingerprint Formation

Operation proceeds from step 216 to step 218. In step 218, fingerprints are formed. Once the fingerprints are formed they are typically stored for future use and operation proceeds from step 218 back to step 204 where the steps of the method 200 are repeated for newly received speech, e.g., of the next communication, e.g., call. The details of an exemplary process of forming fingerprints will now be described.

A sorted list of (freq, time) tuples is formed based on peak positions. Each (freq, time) tuple in the Boolean peak matrix is compared to one or more tuples from the list to form fingerprints. In this example each (freq, time) tuple in the Boolean peak matrix is compared to 4 more tuples from the list to form fingerprints. Consider such a list.

(freq[1], time[1])
(freq[2], time[2])
(freq[3], time[3])
(freq[4], time[4])
(freq[5], time[5])
(freq[6], time[6])

Then fingerprints are formed as time[1]: (freq[1], freq[2], (time[2]−time[1])
time[1]: (freq[1], freq[3], (time[3]−time[1])
time[1]: (freq[1], freq[4], (time[4]−time[1])
time[1]:(freq[1], freq[5], (time[5]−time[1])
time[2]: (freq[2], freq[3], (time[3]−time[2])

Each fingerprint is saved along with the time stamp of the base tuple. Therefore, a list of fingerprints contains entries such as for example, time, freq1, freq2, delta time.

Fingerprints where delta time is larger than 200 are dropped.

Figure 9:
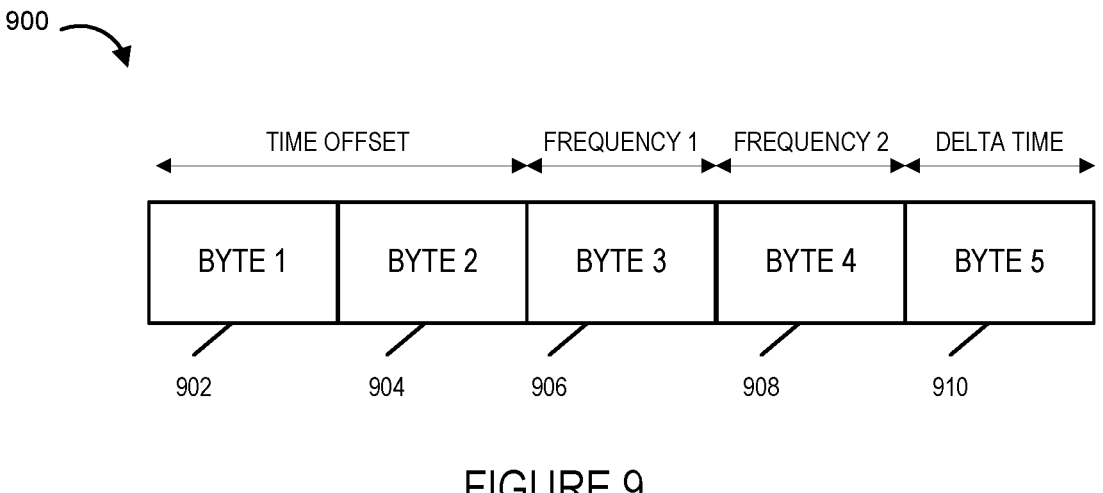
FIG. 9 illustrates the format of an exemplary fingerprint in accordance with an embodiment of the present invention.

Time is in terms of segment number offset, each segment gets computed at 512 samples, at 8000 Hz sample rate. This corresponds to 64 milliseconds. As a result, 2 bytes (16 bits) for timestamp value allows for 4194 seconds. Each quantized frequency/frequency bin can be represented by an 8 bit value (it is less than 256) and delta time (DeltaT) can also be represented by an 8 bit value (1 byte). As a result, each fingerprint size is 5 bytes in this example. Diagram 900 of FIG. 9 illustrates the format of an exemplary fingerprint in accordance with an embodiment of the present invention.

Byte 1 902 and Byte 2 904 contain the time segment offset. Byte 3 906 contains frequency 1 (e.g., quantized frequency 1/frequency bin 1). Byte 4 908 contains frequency 2 (e.g., quantized frequency 2/frequency bin 2). Byte 5 contains the delta time between the location of frequency 1 peak and frequency 2 peak in terms of time segments.

While each (time, frequency) tuple is compared to 4 other

An example of a sorted list of (freq, time) tuples formed based on peak positions in audio signal is shown in FIG. 7 table 700. In this example as shown in table 800 the fingerprint peaks have been sorted into a list so that frequency bin values or quantized frequency values (0-256) for each time offset as well as the time offsets are monotonically increasing. The quantized frequency values (0-256) represent frequencies/frequency bins from 0-2000 Hz.

The entries in row 708 are a table heading including labels which indicate the information contained in each column. The entry "INDEX" in column 702, row 708 indicates that the entries in column 702 for rows 710, 712, 714, 716, 718, 720, 722 specify an index to which the entries in the row correspond. The index is an index to the sorted list of frequency peaks and is provided for demonstrating how the comparing algorithm works as the indexes are used in table 800 to indicate which (freq, time) tuples from the audio signal are being compared to form a corresponding fingerprint. The entry "FREQUENCY (QUANTIZED VALUE 0-255) in column 704, row 708 indicates the entries in column 704 correspond to frequency which has been quantized to a value of 0-255). This quantized frequency is also referred to herein as a frequency bin. The entry "Time Segment Offset" in column 706, row 708 indicates the entries in column 706 correspond to time segment offset location at which the dominant peak frequency in the corresponding row was identified in the audio signal. By way of example, the entry "1" in column 702, row 710 indicates that index 1 corresponds to a (freq, time) tuple for a dominant quantized frequency or frequency bin peak value of 89 (entry column 704, row 710) which is located in the time segment offset 30 (entry column 706, row 710) of the audio signal being processed to generate audio fingerprints. The entry "2" in column 702, row 712 indicates that index 2 corresponds to another (freq, time) tuple for a dominant quantized frequency or frequency bin peak value of 140 (entry column 704, row 712) which is located in the time segment offset 30 (entry column 706, row 712) of the audio signal being processed to generate audio fingerprints.

Fingerprints in table 800 of FIG. 8 are generated, created and/or formed based on the sorted list of (freq, time) tuples shown in table 700 of FIG. 7. The delta time is not a negative value and will always be 0 or greater. The base tuple time offset is always smaller than or equal to the tuple to which it is compared. In generating fingerprints, fingerprints with a delta time greater than 200 would be dropped from the generated fingerprint-set as discussed above although no such delta time occur in this example.

The entries in row 808 are a table heading including labels which indicate the information contained in each column. The entry "BASE TUPLE" in column 802, row 808 indicates that the entries in column 802 for rows 810, 812, 814, 816, 818, 820, 822, 824, 826, 828, 830, 832, 834, 836, 838, 840, 842, 844, 846, 848, and 850 specify the base tuple being used for comparison with another tuple in the corresponding row. The entry "FINGERPRINT TUPLE-OFFSET: (Frequency 1, Frequency 2, Delta T) in column 804, row 808 indicates the entries in column 804 correspond to fingerprint tuple including an ordered set of information of time segment offset of base tuple (frequency 1, frequency 2 and delta time. Frequency 1 being the frequency bin value or quantized frequency value of a first dominant frequency peak. Frequency 2 being the frequency bin value or quantized frequency value of a second dominant frequency peak. And the delta time being the time in the audio signal from where the first dominant frequency peak and the second dominant frequency peak appear. The delta time being calculated in terms of time segment number. The offset value corresponds to the time segment number of the base (time, frequency) tuple. Frequency 1 corresponds to the frequency bin value or quantized frequency value of the base (time, frequency) tuple. The base (time, frequency) tuple corresponding to a first dominant peak being compared to a second dominant peak. The entry "Peaks Compared Indices" in column 806, row 808 indicates the entries in column 806 indicate the indices of the (time, frequency) tuples representing peaks from the table 700 which are being compared to form the fingerprint in the corresponding row. By way of example, fingerprint tuple 30: (89, 140, 0) (entry column 804, row 810) is formed by comparing the (frequency time) tuples from index 1 (row 710 of table 700) and index 2 (row 712 of table 700) as indicated in table 800 entry column 806, row 810 (peaks compared indices 1, 2). The 710 index 1 (frequency, time) tuple being (89, 30) and the 712 index 2 (frequency, time) tuple being (140, 30). The base tuple for this comparison is identified in column 802, row 810 entry which is (89, 30). The fingerprint tuple entry for column 804, row 810 is 30: (89, 140, 0). The segment number offset is 30 which is obtained from the base tuple. Frequency 1 is 89 from the entry in column 704, row 710. Frequency 2 is 140 from the entry in column 704, row 712. The delta T which stands for delta time is the Time offset segment number of the peak corresponding frequency 2 which is 30 from the entry in column 706, row 712 minus the Time offset segment number of the peak corresponding frequency 1 which is 30 from the entry in column 706, row 710 which results in 0 as both the frequency 1 peak and the frequency 2 peak appear in the same time offset segment.

In this example each (freq, time) tuple is compared to 4 more tuples from the list to form fingerprints so the base tuple is the same for rows 810, 812, 814, and 816. The base tuple (76, 36) only has 3 fingerprints formed/generated and shown in table 800 in rows 842, 844, and 846 as there is only data available for three peak comparisons in this example. Similarly, only 2 fingerprints are formed/generated and shown in table 800 in rows 848 and 850 with respect to base tuple (106, 36) as there is only data in this example for two peak comparisons.

A fingerprint-set for media from a communication, e.g., a telephone call, is a collection of all the fingerprints generated from the audio/speech of the communication. These fingerprint-sets are stored, e.g., in memory of the fingerprinting device or in external storage device, e.g., a database system, connected or coupled to the fingerprinting device.

The stored fingerprint-sets for different communications are then matched against fingerprint-sets of other communications, e.g., calls, using a matching method or algorithm to determine similarity or closeness between media of two communications, e.g., calls.

Fuzzy Matching Method/Algorithm

An exemplary fuzzy matching algorithm in accordance with an embodiment of the present invention will now be discussed.

Consider fingerprint-sets computed from a set of known robocalls. The exemplary fuzzy matching method/algorithm addresses the question of how close is a new communication, e.g., call, to existing set of calls by looking for a match between a fingerprint-set generated or created from the new communication, e.g., call, to all the existing robocalls. The first part of the matching method or algorithm is a method to store fingerprint-sets so that the fingerprint-set from a new communication, e.g., call, media can be efficiently matched. The second part of the method/algorithm describes an exemplary matching criteria and associated quantitative measures which indicate relative quality of the match.

Storing Fingerprints

Fingerprint-sets for communications, e.g., calls, are stored using hash maps or dictionaries which have two levels. Fingerprint-set for a specific communication, e.g., call, includes fingerprint tuples (frequency 1, frequency 2, delta time) also sometimes referred to as (f1, f2, deltaT), where deltaT is (time 2–time 1). Along with this fingerprint, a relative offset since beginning of the communication, e.g., call, of where the fingerprint was computed is also used. An example of the format of a fingerprint tuple is shown in diagram 900 of FIG. 9. First, a key value of a given fingerprint returns a SPAM dictionary. This SPAM dictionary contains lists based on key value of the SPAM communication, e.g., call, identifier. The communication identifier is an identifier assigned to or associated with communication for example during the creation or generation of the fingerprint for the communication, e.g., call. For example, call 1, call 2, call 3, etc. The list contains elements which are offsets; these offsets are those of specified fingerprints as they occur in the specified communication, e.g., call. This method of storage allows for efficient retrieval of offsets given fingerprints from a new communication, e.g., call.

Pseudo code for inserting a fingerprint-set is shown below.

```
def insert_fingerprint(fingerprint_dict, f1, f2, deltat, offset, callid):
    spam_dict=fingerprint_dict.get((f1,f2,deltat))
    if (spam_dict):
        # At least one SPAM call exists with given fingerprint
        # So find the list of offsets using call ID key value
        spam_list = spam_dict.get(callid)
        if(spam_list):
            spam_list.append(offset)
        else:
            # start a new list with callid as
            spam_dict[callid] = [indx]
    else:
        # create a new spam dictionary and add it fingerprint dictionary
        spam_dict = { }
        spam_dict[callid]=[ ]
        fingerprint_dict[(f1, f2, deltat)] = spam_dict
```

Matching

An exemplary matching algorithm or method in accordance with an embodiment of the invention will now be discussed. The exemplary matching method or algorithm may be, and in some embodiments is, used to determine if a new communication, e.g., call, is similar to any of the communications, e.g., calls, stored as fingerprints in the fingerprint dictionary. The main concept is that if a series of fingerprints for media of a communication, e.g., call, under test exists in the dictionary then for many of them the relative offset will be similar. The relative offset is defined as the difference between offset of each fingerprint for a communication, e.g., call, under test with offset of fingerprint found in the dictionary. The steps of the exemplary matching method and/or algorithm include:

1. Compute fingerprint-set for call under test/inspection, e.g., using fingerprinting method described in method 200 of FIG. 2.

2. For each fingerprint in the fingerprint-set, generate a set of fuzzy fingerprints. The details of an exemplary method for generating fuzzy fingerprints is described below.
3. Find/identify matches for fuzzy fingerprints. This is a list of tuples (relative offset, communication (e.g., call) ID).
4. Find/identify most commonly occurring relative offsets for matched fingerprints.
5. Rank communications, e.g., calls, with the most commonly occurring offsets. Highest rank communication, e.g., call, from the stored fingerprints is the closest to fingerprint-set under test/inspection.
6. Compute/generate confidence measures/values for matching communication, e.g., call, selection. Poor confidence value is used to reject matching communications, e.g., calls, as not matching.

The example below, shows a comparison of two fingerprint-sets from two communications, e.g., calls. For each communication, e.g., call, a series of value FPn:offset are depicted, where each FPn is a (frequency1, frequency2, deltaT) tuple. In this example, FP1-FP5 match and the relative offset for those matches is 10, and FP6 match has relative offset of 11. In the first communication, e.g., call, the offsets for the matching fingerprints FP1, FP2, FP3, FP4 and FP5 are 200-204 respectively and in the second communication, e.g., call, the offsets for the matching fingerprints FP1, FP2, FP3, FP4, and FP5 are 210-214 respectively.

So for this example, relative offset of 10 is observed for 5 fingerprints. And, the relative offset of 11 is observed for 1 fingerprint (i.e., comparison of FP6 in the first and second communications). Therefore, the commonly occurring offset of 10 occurs the most as the number of matching fingerprints with this offset is 5. The offset of 11 is the second most commonly occurring offset as it occurs once in this example.

. . . FP1:200, FP2:201, FP3:202, FP4:203, FP5:204, FP6:204 . . .

. . . FP1:210, FP2:211, FP3:212, FP4:213, FP5:214, FP6:215 . . .

The table below shows a summary of the results of the comparison of the first fingerprint-set corresponding to the first communication and the second fingerprint-set corresponding to the second communication. Each entry in the first column of the table is a commonly occurring offset determined for matching fingerprints. Each entry in the second column of the table is the number of matching fingerprints with the commonly occurring offset shown in first column entry in the same row of the table. Hence, the table illustrates that there are 5 fingerprint matches with an offset of 10 and there is one fingerprint match with an offset of 11.

| Commonly Occurring Offset of Fingerprint Matches | Number of Matching Fingerprints with the Commonly Occurring Offset |
|---|---|
| 10 | 5 |
| 11 | 1 |

The output of the matching method/algorithm is for a fingerprint-set is a list of ranked communications, e.g., calls, in descending order (best match to least) along with confidence measures/values for the matches.

Fuzzy Fingerprints

Each fingerprint is a tuple (frequency 1, frequency 2, deltaT). Computations of frequencies using spectrogram (block FFT) may, and sometimes does, result in small errors.

To include possibilities of such errors, instead of exact frequencies and time differences, a fuzzy neighborhood set of fingerprints are generated from each computed/generated/created fingerprint. Frequency bin values are allowed error tolerances in a logarithmic manner for frequency range. In the way, for each fingerprint, multiple fingerprints (fuzzy fingerprints) are checked for a match. Frequencies are in the range (0, 256) corresponding to 0-2000 Hz. Fuzzy frequencies may be, and sometime are, generated as described below.

> if (1<frequency<64):
>
> (range(frequency−1,frequency+1))
>
> if (64<=frequency<128):
>
> (range(frequency−2,frequency+2))
>
> if (128<=frequency<256):
>
> (range(frequency−4,frequency+4))

In addition to creating multiple fuzzy fingerprints due to frequency ranges, multiple fingerprints with time offsets of +−1 are also created/generated. In this example, the time offset tolerance is +−1. For example, for an original fingerprint of (54,59,200) the following set of fuzzy fingerprints are generated/created.

(53,58,200), (53,59,200), (53, 60, 200),
(53, 58, 201), (53,59, 201), (53,60, 201)
(53, 58, 199), (53, 59, 199), (53, 60, 199)
(54, 58, 200), (54, 59, 200), (54, 60, 200)
(54, 58, 201), (54, 59, 201), (54, 60, 201)
(54, 58, 199), (54, 59, 199), (54, 60, 199)
(55, 58, 200), (55, 59, 200), (55, 60, 200)
(55, 59, 201), (55, 59, 201), (55, 60, 201)
(55, 59, 199), (55, 59, 199), (55, 60, 199)

A match to any one of the fuzzy fingerprints is considered/determined to be a match to the original base fingerprint from which the fuzzy fingerprints were generated/created as it is within the error tolerance.

Find Matches

Matches are tuples (offset, communication, e.g., call, ID) and are found by querying the fingerprint dictionary for each fuzzy fingerprint. After this, only unique fingerprint matches which belong to the base fingerprint are saved. A base fingerprint, may, and sometimes does, result in several fuzzy fingerprints and matches. If there are multiple identical matches for a base fingerprint, only one is saved. These matches are then inspected to check which offsets occur most often.

Commonly Occurring Matches

Lists of matches are grouped by commonly occurring offsets. A communication ID, e.g., call ID, with the largest commonly occurring matches is selected as the winner, deemed to be the closest media. For a fingerprint-set of unique fingerprints, if compared to itself, the size of commonly occurring offsets is the size of the set itself since all fingerprints will have the same offset of zero.

Confidence Measures

Confidence measures are two number fractions that are based on how well the fingerprints of a communication, e.g., call, under test/inspection match with the data in data base (dictionary). A communication, e.g., call, under test may be of shorter or longer duration than the one in the dictionary and may not have a perfect match with a dictionary robocall. These measures provide additional criteria or confidence for best matches.

Confidence measures are based on the occurrences of commonly occurring matches. In addition, to most commonly occurring matches, other groups with offsets in the neighborhood of 10 are added up. For example, a communication, e.g., call, under test/inspection with 500 matches has 100 matches with offset of −40, 80 matches with offset of −39, and 50 matches with offset of −41. In this case, the total common occurrences is determined/considered to be 100+80+50=230. Two measures are considered.

Input Confidence: (common occurrences/number of fingerprints in the communication, e.g., call under test)
The Input Confidence computes/determines the fraction of fingerprints in the input communication, e.g., call, that match to a specific communication, e.g., call, in the dictionary.
Fingerprinting Confidence: (common occurrences/number of fingerprints in the matched communication, e.g., call, in the dictionary)
The Fingerprinting Confidence computes/determines the fraction of fingerprints in the communication, e.g., call, in the dictionary that are matched by the incoming communication, e.g., call.

For example, if the communication, e.g., call, under test is a smaller subset of stored communication, e.g., call, of shorter time duration and hence has fewer fingerprints in the stored communication, e.g., call, its input confidence will be high but its fingerprinting confidence may, and sometimes is, lower.

In addition to ranking of the matches, confidence measures determine quality of the matches. For example, the best matched communication, e.g., call, may have a poor confidence. Or in another example, the top 5 matches may have 2 with high confidence and 3 with poor or low confidence. The confidence measures allow for the determination of the best matches with the highest confidence. In various embodiments, communications, e.g., calls, with a very small number of fingerprints for analysis are discarded, as such communications, e.g., calls, may, and typically do, contain, very little actual speech and could form false matches. The actual thresholds for confidence measures and size of fingerprint-sets for a match decision, may be, and in various instances, are derived based on observed datasets of robocalls.

Some of the features of the system/device for generating communications media fingerprints as describe above include: (1) the use of sampling rate of 8000 Hz (telephony voice): (2) use of a simple low complexity Voice Activated Detector to reject/remove low signals, e.g., silence; (3) quantization of power spectral densities to improve peak value fidelity and reduce noise; (4) application of an erosion filter to reduce the number of fingerprints due to more stationary media; (5) dropping higher frequencies as they tend to not be from human telephony speech; (6) sort by power spectrum to keep only dominant peaks, (7) use of tuples directly rather than to compute a hash for fingerprints, since it creates a smaller size fingerprint; (8) use of dictionaries to efficiently store and retrieve communications media fingerprints, (9) use of fuzzy fingerprints to account for error(s) due to compression algorithms and different window selection due to how exactly FFT window is used, peaks also can have quantization error in time and, use of the fuzzy fingerprint algorithm accounts for/addresses such errors, (10) use of confidence measures for rejecting unlikely matches, (11) use of communications media, e.g., audio, fingerprints to automatically identify SPAM communications and/or robocalls and/or block SPAM communications and/or robocalls. While various embodiments have been discussed above, it should be appreciated that not necessarily all embodiments include the same features and some of the features described above are not necessary but can be desirable in some embodiments.

FIG. 10 comprises the combination of FIGS. 10A, 10B, and 10C. FIG. 10A illustrates the first part of an exemplary flowchart of a method 1000 in accordance with an embodiment of the present invention. FIG. 10B illustrates the second part of an exemplary flowchart of a method 1000 in accordance with an embodiment of the present invention. FIG. 10C illustrates the third part of an exemplary flowchart of a method 1000 in accordance with an embodiment of the present invention.

For explanatory purposes the exemplary method 1000 will be explained in connection with the exemplary computing device 100 illustrated in FIG. 1. However, it should be understood that the method may be implemented using other systems and other system configurations then those illustrated in FIG. 1. While it will be readily understood that additional steps and signaling are performed in connection with communicating, processing and storage of information, data, messages, and signals, the method 1000 focuses on and discusses the steps and/or signaling for understanding the invention.

The method 1000 starts in start step 1002 shown on FIG. 10A. Operation proceeds from start step 1002 to optional step 1004. Optional steps in the method may be, and in some embodiments are, not implemented and/or are skipped during processing.

In optional step 1004, the computing device 100, decodes digitally encoded audio, e.g., a portion of digitally encoded audio from a first call. Operation proceeds from optional step 1004 to optional step 1006. In step 1006, the computing device 100 converts the sampling rate for the audio to an 8 KHz sampling rate when the sampling rate is not 8 KHz. Operation proceeds from step 1006 to step 1008.

In step 1008, the computing device 100 removes silence from an audio signal, e.g., the portion of the audio from a first call that has been decoded and converted to a sampling rate of 8 KHz. In some embodiments, step 1008 includes one or more sub-steps 1010, 1012, 1014, 1016, and 1018.

In sub-step 1010 a voice activated detector is used to determine portions of the audio signal with a signal level less than a first threshold value (e.g., a low signal level value such as for example 60 dB). The portions of the audio signal which are less than the first threshold value being determined to be silence.

In sub-step 1012, the portions of the audio signal determined to be silence are removed.

In sub-step 1014, the audio signal is partitioned into a plurality of different portions with each portion corresponding to a period of time (e.g., the audio signal is divided into a plurality of 10 millisecond non-overlapping portions).

In sub-step 1016, each of the plurality of audio signal portions of the plurality of different portions is DC filtered and a sum-square magnitude is computed as a sum of sample value squares.

In sub-step 1018, any of the audio signal portions of the plurality of portions having a sum-square magnitude less than a first speech threshold value (e.g., 32*32*80) is removed as silence.

Operation proceeds from 1008 to step 1020. In step 1020, the computing device determines for a plurality of time segments of the audio signal power spectral density values of the audio signal for each of a plurality of N different frequency bins, N being an integer greater than 1 (e.g., N being 513). Operation proceeds from step 1020 to step 1022.

In step 1022, the computing device quantizes the determined power spectral density (PSD) values of the audio signal. In some embodiments step 1022 includes sub-step 1024. In sub-step 1024, the computing device quantizes the PSD values to 1 dB steps by applying a floor function. Operation proceeds from step 1022 to step 1026.

In step 1026, the computing device performs a filtering operation on the audio signal to remove high frequency signals above a first frequency threshold (e.g., above 2000 Hz). In some embodiments, step 1026 includes sub-step 1028. In sub-step 1028, the computing device filters out power spectral density values corresponding to frequency bins 256 to 513 when N is 513. Operation proceeds from step 1026 to step 1032 shown on FIG. 10B via connection node A 1030.

In step 1032, the computing device 100 identifies (i) a plurality of dominant frequency peaks based on the determined power spectral density values, and (ii) positions in the audio signal corresponding to the identified peaks. In some embodiments step 1032 includes one or more sub-steps 1034, 1036, 1038 and 1040.

In sub-step 1034, the computing device 100 identifies for each of the plurality of time segments of the audio signal a set of frequency bins with the highest power spectral density values above a first threshold value. The set of frequency bins has M or fewer entries, where M is an integer having a value less than M (e.g., N=513 and M=4). In various embodiments, the identified positions in the audio signal correspond to the identified peaks are times corresponding to the time segments in which the identified peaks appear. In some embodiments, each of the power spectral density values for a time segment is a measure of the audio signal's power content versus frequency for the time segment and frequency bin. In some embodiments, each of the power spectral density values is an amplitude. In some embodiments, the audio signal is a portion of a first call (e.g., voice call media).

In sub-step 1036, the computing device 100 generates a spectrogram of power spectral density values based on: (i) the determined power spectral density values of the audio signal, (ii) the set of frequency bins, and (iii) the plurality of time segments. FIG. 4 illustrates and exemplary spectrogram of power spectral density values 400.

In sub-step 1038, the computing device 100 applies a maximal filter to the spectrogram of power spectral density values to locate frequency peaks in the spectrogram.

In sub-step 1040, the computing device 100 applies an erosion filter to the spectrogram of power spectral density values after applying the maximal filter.

Operation proceeds from step 1032 to step 1042.

In step 1042, the computing device 100 generates a first audio fingerprint from at least some of the identified plurality of dominant frequency peaks and the identified positions in the audio signal corresponding to the identified peaks. In some embodiments step 1042 includes sub-step 1044.

In sub-step 1044, the computing device 100 generates the first audio fingerprint wherein the first audio fingerprint includes and/or consists of and/or consists essentially of: an order set of information including a first time, a first frequency bin, a second frequency bin, and a delta time. The first frequency bin value corresponds to a first dominant frequency peak. The first dominant frequency peak is one of the identified dominant frequency peaks. The second dominant frequency bin value corresponds to a second dominant frequency peak. The second dominant frequency peak is one of the identified dominant frequency peaks. The first dominant frequency peak and the second dominant frequency peak are different dominant frequency peaks. The first time is a first identified location in the audio signal corresponding to the first dominant frequency peak. The first time is a time corresponding to a first time segment of the plurality of time segments. The first dominant frequency peak appears in the first time segment. The second identified location in the audio signal corresponding to the second dominant frequency peak is a second time corresponding to a second time segment in the audio signal in which the second dominant frequency peak appears. The delta time is a time difference between a second identified location in the audio signal corresponding to the second dominant frequency peak and the first identified location in the audio signal corresponding to the first dominant frequency peak. In various embodiments, the delta time is expressed in terms of time segment. For example, if both the first dominant frequency peak and the second dominant frequency peak are in the same time segment than the delta time is 0. If the second dominant frequency peak is in the second time segment then the delta time is (second time segment-first time segment). The second dominant peak always being located after the first dominant frequency peak in the audio signal. Operation proceeds from step 1042 to step 1048 shown on FIG. 10C via connection node B 1046.

In step 1048, the computing device 100 uses the first audio fingerprint to determine if the first call from which the audio signal was obtained is a robocall. In some embodiments step 1048 includes one or more sub-steps 1050, 1052, and 1056.

In sub-step 1050, the computing device 100 compares the first audio fingerprint to audio fingerprints generated from one or more different calls.

In sub-step 1052, the computing device 100 generates a set of fuzzy audio fingerprints from the first audio fingerprint. In some embodiments, sub-step 1052 includes sub-step 1054. In sub-step 1054, the computing device modifies one or more of the following first audio fingerprint: the first frequency bin, the second frequency bin or the delta time to generate the set of fuzzy audio fingerprints from the first audio fingerprint.

In sub-step 1056, the computing device 100 compares the generated fuzzy audio fingerprints of the set of fuzzy audio fingerprints to audio fingerprints generated from one or more different calls to determine if there is a match.

Operation proceeds from step 1048 to step 1058. In step 1058, the computing device 100 generates a first fingerprint-set for the first call. In some embodiments, step 1058 includes sub-step 1060. In sub-step 1060, the computing device 100 generates a plurality of audio fingerprints from the identified plurality of dominant frequency peaks and the identified positions in the audio signal corresponding to the identified dominant frequency peaks. The first audio fingerprint being one of the plurality of audio fingerprints. Operation proceeds from step 1058 to step 1062.

In step 1062, the computing device 100 generates a fingerprint-set dictionary for the first call. The fingerprint-set dictionary includes a key value which identifies individual fingerprints for the first call, and a list of time entries identifying individual fingerprints in the fingerprint-set for the call by time in the audio signal to which the individual fingerprint corresponds. Operation proceeds from step 1062 to step 1064.

In step 1064, the computing device 100 receives and processes additional audio repeating the steps of the method.

In some embodiments, the method 1000 is implemented by one or more devices such as a audio fingerprinting entity.

In some embodiments, the audio fingerprinting entity is a communications processing device or network equipment such as a Session Border Controller or Media Gateway. In some embodiments in which the method 1000 or various steps of method 1000 are implemented by a Session Border Controller, the Session Border Controller receives the audio signal as encoded audio. The first audio fingerprint is then generated by the Session Border Controller from the received encoded audio as it passes through the Session Border Controller. In various embodiments, audio fingerprints including the first audio fingerprint are generated in real-time without the audio being saved.

In various embodiments of method 1000, the audio signal is a digital signal that has been encoded using a telephony codec (e.g., an ITU-T G.711 A-law or Mu-law codec). In various embodiments of the method 1000, the audio signal is a digital signal that has been encoded and compressed using a standards-based speech codec (e.g., an ITU-T G.729A or Adaptive Multi-Rate (AMR) codec).

In some embodiments, the step of removing silence from the audio signal is performed by using voice activation detection to determine portions of the audio signal with low signal strength (e.g., less than 60 dB signal level) for a duration of time equal to or greater than a first time threshold value (e.g., 10 ms).

FIG. 11 as discussed above is a drawing illustrating an assembly of components 1100 which may be included in an exemplary communications processing device, e.g., communications processing device 100 of FIG. 1. Assembly of components 1100 can be, and in some embodiments is, used in communications processing device 100. The components in the assembly of components 1100 can, and in some embodiments are, implemented fully in hardware within the processor 106, e.g., as individual circuits. The components in the assembly of components 1100 can, and in some embodiments are, implemented fully in hardware within the assembly of components 119, e.g., as individual circuits corresponding to the different components. In other embodiments some of the components are implemented, e.g., as circuits, within the processor 106 with other components being implemented, e.g., as circuits within assembly of components 119, external to and coupled to the processor 106. As should be appreciated the level of integration of components on the processor and/or with some components being external to the processor may be one of design choice. Alternatively, rather than being implemented as circuits, all or some of the components may be implemented in software and stored in the memory 110 of the computing device 100, with the components controlling operation of computing device 100 to implement the functions corresponding to the components when the components are executed by a processor, e.g., processor 106. In some such embodiments, the assembly of components 1100 is included in the memory 110 as assembly of components 118. In still other embodiments, various components in assembly of components 1100 are implemented as a combination of hardware and software, e.g., with another circuit external to the processor providing input to the processor 106 which then under software control operates to perform a portion of a component's function. While shown in the FIG. 1 embodiment as a single processor, e.g., computer, it should be appreciated that the processor 106 may be implemented as one or more processors, e.g., computers.

When implemented in software the components include code, which when executed by the processor 106, configure the processor 106 to implement the function corresponding to the component. In embodiments where the assembly of components 1100 is stored in the memory 110, the memory 110 is a computer program product comprising a computer readable medium comprising code, e.g., individual code for each component, for causing at least one computer, e.g., processor 106, to implement the functions to which the components correspond.

Completely hardware based or completely software based components may be used. However, it should be appreciated that any combination of software and hardware, e.g., circuit implemented components may be used to implement the functions. As should be appreciated, the components illustrated in FIG. 11 control and/or configure the computing device 100 or elements therein such as the processor 106, to perform the functions of corresponding steps illustrated and/or described in the methods described herein and in one or more of the flowcharts of FIG. 2, FIG. 10, and/or described with respect to any of the Figures. Thus the assembly of components 1100 includes various components that perform functions of corresponding steps of FIG. 2 and/or FIG. 10.

Assembly of components 1100 includes the following components. A control routines component 1102 configured to control the operation of the computing device. A communications component 1104 configured to provide communications functionality including communications signaling and support for various communications protocols and interfaces. An incoming communications processing component 1106 configured to provide processing for incoming communications, e.g., calls. Determinator component 1108 is configured to make determinations for the communications processing device, e.g., if a fingerprint being analyzed matches a stored robocall fingerprint.

Assembly of components 1100 further includes communications, e.g., call detail record generator component 1110 which is configured to generate communication, e.g., call, detail records from communication, e.g., call, information.

Media, e.g., call audio, fingerprinting component 1112 which is configured to generate and process media fingerprints including generating fuzzy fingerprints, matching of fingerprints, generating and providing confidence values for matches of media fingerprints.

Decode compressed speech component 1114 decodes encoded compressed speech and converts it to 8 Kilohertz (KHz).

Low signal, e.g., silence, removal component 1116 removes low signal and silence segments from decoded speech.

Voice Activated Detector (VAD) component 1118 removes silence and/or low signals from digitized speech. In some embodiments, the VAD component 1118 is a sub-component of the low signal removal component 1116.

Power Spectral Density (PSD) Spectrogram generator component 1120 generates PSD spectrograms.

Maximal Filter Component 1122 applies maximal filters to PSD spectrograms.

The Erosion filter component 1124 performs one or more of the following operations: suppresses low level peaks, quantizes peaks to 1 dB and applies an erosion filter to remove repeated peaks in a spectrogram.

Power spectrum amplitude sorter component 1126 performs sorting of PSD by amplitude, e.g., as discussed in step 216 of method 200.

Fingerprint formation component 1128 forms/generates/creates fingerprints, e.g., media communications fingerprints, fingerprint-sets, fuzzy fingerprints. In some embodiments, the fingerprint formation component 1128 is a sub-component of media fingerprinting component 1112.

Fingerprint storage component 1130 performs formatting, storage and retrieval of fingerprints to/from memory and/or database systems. In some embodiments, fingerprint storage component 1130 is a sub-component of media fingerprinting component 1112.

Fingerprint matching component 1132 performs operations to determine if fingerprints match. In some embodiments, fingerprint matching component 1132 includes fuzzy fingerprint matching component 1134 which matches fuzzy fingerprints. In some embodiments, fingerprint matching component 1132 is a sub-component of media fingerprinting component 1112.

Fingerprint matching confidence value generator component 1136 performs operations to generate and/or determine confidence values for matched fingerprints. In some embodiments, fingerprint matching confidence value generator component 1136 includes one or more of the following: input confidence value generator component 1138 and fingerprinting matching confidence value generator component 1140. The input confidence value generator component 1138 generates input confidence values. The fingerprinting matching confidence value generator component 1140 generates fingerprinting matching confidence values. In some embodiments, fingerprint matching confidence value generator component 1136 is a sub-component of media fingerprinting component 1112.

The communications processing device and/or the fingerprinting generation and processing operations described herein may be, and in some embodiments, are implemented on a compute node in the cloud. The compute node including a processor. The processor being coupled to memory. In some embodiments, each of the devices, systems and/or nodes described herein are implemented by a system including one or more processors and memory, the memory including instructions which when executed by the one or more processors control the operation of the system.

In some embodiments, the computing device and/or communications processing device and/or fingerprinting generation and processing operations described herein are implemented using network function virtualization.

In some embodiments, the computing device, communications processing device, fingerprinting entity/device, SBC and/or other entities are virtual devices implemented on compute nodes in a cloud system wherein the compute node includes a processor and memory or is attached to a memory. In various embodiments, the computing device, communications processing device, fingerprinting entity/device, SBC, and/or other entities of the system are implemented as native applications executing on a compute node.

In some embodiments, the generation of communications media fingerprints is performed in real-time. In some embodiments, the generation of fuzzy fingerprints and matching of fingerprints is not performed in real time but after fingerprint-sets have been generated for communications, e.g., calls, passing through the communications processing device. In some embodiments, the generation of fuzzy fingerprints and matching occurring off-line. In some embodiments, while a PSD spectrogram is created or generated in real-time from which to generate fingerprints, the generation of the fingerprints is not performed in real-time allowing the processing to be off-loaded. The use of power spectral densities for fingerprint avoid the need to save actual audio of a call and also prevent the information about the media of the call, e.g., call audio from being reproduced from the saved information, e.g., the PSD information.

Various embodiments of the present invention will now be discussed.

LISTING OF NUMBERED METHOD
EMBODIMENTS

Method Embodiment 1. A method of processing an audio signal comprising: removing silence from the audio signal; determining, for a plurality of time segments of the audio signal, power spectral density values of the audio signal for each of a plurality of N different frequency bins, N being an integer greater than 1 (e.g., 513); identifying (i) a plurality of dominant frequency peaks based on the determined power spectral density values, and (ii) positions in the audio signal corresponding to the identified peaks; and generating a first audio fingerprint from at least some of the identified plurality of dominant frequency peaks and the identified positions in the audio signal corresponding to the identified peaks.

Method Embodiment 1A. The method of Method Embodiment 1, wherein said first audio fingerprint is generated by an audio fingerprinting entity.

Method Embodiment 1B. The method of Method Embodiment 1, wherein said audio fingerprinting entity is a Session Border Controller; and wherein said Session Border Controller receives said audio signal as encoded audio, said first audio fingerprint being generated as said audio signal passes through said Session Border Controller.

Method Embodiment 2. The method of Method Embodiment 1, wherein said identifying a plurality of dominant frequency peaks based on the determined power spectral density values includes: identifying for each of the plurality of time segments of the audio signal a set of frequency bins with the highest power spectral density values above a first threshold value, said set of frequency bins having M or fewer entries, where M is less than N, and where M is an integer (e.g., N=513 and M=4); and wherein said identified positions in the audio signal corresponding to the identified peaks are times corresponding to the time segments in which the identified peaks appear.

Method Embodiment 2A. The method of Method Embodiment 1, wherein each of said power spectral density values for a time segment is a measure of the audio signal's power content versus frequency for the time segment and frequency bin.

Method Embodiment 2A1. The method of Method Embodiment 1, wherein each of said power spectral density values is an amplitude.

Method Embodiment 2B. The method of Method Embodiment 1, wherein said audio signal is a portion of a first call (e.g., voice call media).

Method Embodiment 3. The method of Method Embodiment 1, further comprising: performing, prior to said identifying (i) a plurality of dominant frequency peaks based on the determined power spectral density values and (ii) positions in the audio signal corresponding to the identified peaks, a filtering operation on the audio signal to remove high frequency signals above a first frequency threshold level (e.g., above 2000 Hz as audio signals above 2 KHz tend not to be from human telephony speech).

Method Embodiment 3A. The method of Method Embodiment 3, wherein N=513; and wherein said performing a filtering operation on the audio signal to remove high frequency signals above a first frequency threshold level includes filtering out power spectral density values corresponding to frequency bins N=256 to 513, which corresponds to the range of 2000-4000 Hz.

Method Embodiment 4. The method of Method Embodiment 1, further comprising: quantizing the determined power spectral density (PSD) values of the audio signal (e.g., quantize the PSD values to 1 dB steps by applying a floor function).

Method Embodiment 5. The method of Method Embodiment 4, wherein said step of identifying (i) a plurality of dominant frequency peaks based on the determined power spectral density values, and (ii) positions in the audio signal corresponding to the identified peaks includes: generating a spectrogram of power spectral density values based on: (i) said determined power spectral density values of the audio signal, (ii) the set of frequency bins, and the plurality of time segments; and applying a maximal filter to said spectrogram of power spectral density values to locate frequency peaks in said spectrogram.

Method Embodiment 6. The method of Method Embodiment 5, wherein said step of identifying (i) a plurality of dominant frequency peaks based on the determined power spectral density values, and (ii) positions in the audio signal corresponding to the identified peaks further includes: applying an erosion filter to said spectrogram of power spectral density values after applying said maximal filter.

Method Embodiment 7. The method of Method Embodiment 1, wherein said audio signal is a portion of digitally encoded audio from a first call; and wherein said method of processing said audio signal further includes prior to determining, for a plurality of time segments of the audio signal, power spectral density values of the audio signal for each of a plurality of N different frequency bins: decoding said digitally encoded audio; and converting said sampling rate for said audio to an 8 KHz sampling rate when said sampling rate is not 8 KHz.

Method Embodiment 7A. The method of Method Embodiment 7, wherein said audio signal is a digital signal that has been encoded using a telephony codec (e.g., an ITU-T G.711 A-law or Mu-law codec).

Method Embodiment 7B. The method of Method Embodiment 7, wherein said audio is a digital signal that has been encoded and compressed using a standards-based speech codec (e.g., an ITU-T G.729A or Adaptive Multi-Rate (AMR) codec).

Method Embodiment 8. The method of Method Embodiment 7 further comprising: using the first audio fingerprint to determine if the first call is a robocall.

Method Embodiment 8A. The method of Method Embodiment 8, wherein using the first audio fingerprint to determine if the first call is a robocall includes comparing the first audio fingerprint to audio fingerprints generated from one or more different calls.

Method Embodiment 8B. The method of Method Embodiment 8, wherein using the first audio fingerprint to determine if the first call is a robocall includes: generating a set of fuzzy audio fingerprints from the first audio fingerprint and comparing the generated fuzzy audio fingerprints to audio fingerprints generated from one or more different calls to determine if there is a match.

Method Embodiment 8B1. The method of Method Embodiment 8B, wherein said first audio fingerprint is an ordered set of information including a first time, a first frequency bin, a second frequency bin, and a delta time; wherein said generating a set of fuzzy audio fingerprints from the first audio fingerprint includes modifying one or more of the following of the first audio fingerprint: the first frequency bin, the second frequency bin, or the delta time.

Method Embodiment 9. The method of Method Embodiment 2, wherein said first audio fingerprint is an ordered set of information including a first time, a first frequency bin, a second frequency bin, and a delta time; wherein said first frequency bin value corresponds to a first dominant frequency peak, said first dominant frequency peak being one of the identified dominant frequency peaks; wherein said second frequency bin value corresponds to a second dominant frequency peak, said second dominant frequency peak being one of the identified dominant frequency peaks, said first dominant frequency peak and said second dominant frequency peak being different dominant frequency peaks; wherein said first time is a first identified location in the audio signal corresponding to the first dominant frequency peak, said first time being a time corresponding to a first time segment of the plurality of time segments, said first dominant frequency peak appearing in said first time segment; wherein said delta time is a time difference between a second identified location in the audio signal corresponding to the second dominant frequency peak and the first identified location in the audio signal corresponding to the first dominant frequency peak.

Method Embodiment 9A. The method of Method Embodiment 2, wherein said first audio fingerprint is a tuple including a first time, a first frequency bin, a second frequency bin, and a delta time; wherein said first frequency bin corresponds to a first dominant frequency peak, said first dominant frequency peak being one of the identified dominant frequency peaks; wherein said second frequency bin corresponds to a second dominant frequency peak, said second dominant frequency peak being one of the identified dominant frequency peaks, said first dominant frequency peak and said second dominant frequency peak being different dominant frequency peaks; wherein said first time is a first identified location in the audio signal corresponding to the first dominant frequency peak, said first time being a time corresponding to a first time segment of the plurality of time segments, said first dominant frequency peak appearing in said first time segment; wherein said delta time is a time difference between a second identified location in the audio signal corresponding to the second dominant frequency peak and the first identified location in the audio signal corresponding to the first dominant frequency peak.

Method Embodiment 9B. The method of Method Embodiment 9, wherein said second identified location in the audio signal corresponding to the second dominant frequency peak is a second time corresponding to a second time segment in the audio signal in which the second dominant frequency peak appears.

Method Embodiment 9C. The method of Method Embodiment 9, wherein when the first dominant frequency peak and the second dominant frequency peak are located in the same time segment, said delta time is zero.

Method Embodiment 10. The method of Method Embodiment 2, further comprising: generating a first fingerprint-set for a first call, said audio signal being from said first call, said generating a first fingerprint-set for the first call including generating a plurality of audio fingerprints from the identified plurality of dominant frequency peaks and the identified positions in the audio signal corresponding to the identified peaks, said first audio fingerprint being one of said plurality of audio fingerprints.

Method Embodiment 11. The method of Method Embodiment 10, further comprising: generating a fingerprint-set dictionary for the first call, said fingerprint-set dictionary including a key value identifying individual fingerprints for the first call, and a list of time entries identifying individual fingerprints in the fingerprint-set for the call by the time in the audio signal to which the individual fingerprint corresponds.

Method Embodiment 12. The method of Method Embodiment 1, wherein said step of removing silence from the audio signal is performed using av voice activated detector (e.g., a low complexity voice activated detector).

Method Embodiment 12A. The method of Method Embodiment 1, wherein said step of removing silence from the audio signal includes: (i) using voice activation detection to determine portions of the audio signal with a signal level less than a first threshold value (e.g., a low signal level), said portions of the audio signal being less than the first threshold value being determined to be silence; and (ii) removing portions of the audio signal determined to be silence.

Method Embodiment 12B. The method of Method Embodiment 12A, wherein said first threshold value is 60 dB.

Method Embodiment 12C. The method of Method Embodiment 12, wherein said step of removing silence from the audio signal includes: (i) partitioning the audio signal into a plurality of different portions with each portion corresponding to a period of time (e.g., dividing the audio signal up into a plurality of 10 ms non-overlapping portions); (ii) each of the plurality of audio signal portions of the plurality of different portions is DC filtered and a sum-square magnitude is computed as a sum of sample value squares; and (iii) removing as silence any of the audio signal portions of the plurality of portions having a sum-square magnitude less than a first speech threshold value (e.g., $32*32*80$).

Method Embodiment 12D. The method of Method Embodiment 1, wherein said step of removing silence from the audio signal is performed by using voice activation detection to determine portions of the audio signal with low signal strength (e.g., less than 60 dB signal level) for a duration of time equal to or greater than a first time threshold value (e.g., 10 ms).

LISTING OF NUMBERED SYSTEM EMBODIMENTS

System Embodiment 1. A system for processing an audio signal comprising: a audio fingerprinting device including a first processor, said first processor controlling the audio fingerprint device to perform the following operations: removing silence from the audio signal; determining, for a plurality of time segments of the audio signal, power spectral density values of the audio signal for each of a plurality of N different frequency bins, N being an integer greater than 1 (e.g., 513); identifying (i) a plurality of dominant frequency peaks based on the determined power spectral density values, and (ii) positions in the audio signal corresponding to the identified peaks; and generating a first audio fingerprint from at least some of the identified plurality of dominant frequency peaks and the identified positions in the audio signal corresponding to the identified peaks.

System Embodiment 1A. The system of System Embodiment 1, wherein said audio fingerprinting device is a communications processing device.

System Embodiment 1B. The system of System Embodiment 1, wherein said audio fingerprinting entity is a Session Border Controller; and wherein said Session Border Controller receives said audio signal as encoded audio, said first audio fingerprint being generated as said audio signal passes through said Session Border Controller.

System Embodiment 2. The system of System Embodiment 1, wherein said identifying a plurality of dominant frequency peaks based on the determined power spectral density values includes: identifying for each of the plurality of time segments of the audio signal a set of frequency bins with the highest power spectral density values above a first threshold value, said set of frequency bins having M or fewer entries, where M is less than N, and where M is an integer (e.g., N=513 and M=4); and wherein said identified positions in the audio signal corresponding to the identified peaks are times corresponding to the time segments in which the identified peaks appear.

System Embodiment 2A. The system of System Embodiment 1, wherein each of said power spectral density values for a time segment is a measure of the audio signal's power content versus frequency for the time segment and frequency bin.

System Embodiment 2A1. The system of System Embodiment 1, wherein each of said power spectral density values is an amplitude.

System Embodiment 2B. The system of System Embodiment 1, wherein said audio signal is a portion of a first call (e.g., voice call media).

System Embodiment 3. The system of System Embodiment 1, wherein said first processor further controls the audio fingerprint device to perform the following operations: performing, prior to said identifying (i) a plurality of dominant frequency peaks based on the determined power spectral density values and (ii) positions in the audio signal corresponding to the identified peaks, a filtering operation on the audio signal to remove high frequency signals above a first frequency threshold level (e.g., above 2000 Hz as audio signals above 2 KHz tend not to be from human telephony speech).

System Embodiment 3A. The system of System Embodiment 3, wherein N=513; and wherein said performing a filtering operation on the audio signal to remove high frequency signals above a first frequency threshold level includes filtering out power spectral density values corresponding to frequency bins N=256 to 513, which corresponds to the range of 2000-4000 Hz.

System Embodiment 4. The system of System Embodiment 1, wherein said first processor further controls the audio fingerprint device to perform the following operations: quantizing the determined power spectral density (PSD) values of the audio signal (e.g., quantize the PSD values to 1 dB steps by applying a floor function).

System Embodiment 5. The system of System Embodiment 4, wherein said operation of identifying (i) a plurality of dominant frequency peaks based on the determined power spectral density values, and (ii) positions in the audio signal corresponding to the identified peaks includes: generating a spectrogram of power spectral density values based on: (i) said determined power spectral density values of the audio signal, (ii) the set of frequency bins, and the plurality of time segments; and applying a maximal filter to said spectrogram of power spectral density values to locate frequency peaks in said spectrogram.

System Embodiment 6. The system of System Embodiment 5, wherein said operation of identifying (i) a plurality of dominant frequency peaks based on the determined power spectral density values, and (ii) positions in the audio signal corresponding to the identified peaks further includes: applying an erosion filter to said spectrogram of power spectral density values after applying said maximal filter.

System Embodiment 7. The system of System Embodiment 1, wherein said audio signal is a portion of digitally encoded audio from a first call; and wherein said first processor controls the audio fingerprint device prior to determining, for a plurality of time segments of the audio signal, power spectral density values of the audio signal for each of a plurality of N different frequency bins to perform the following operations: decoding said digitally encoded audio; and converting said sampling rate for said audio to an 8 KHz sampling rate when said sampling rate is not 8 KHz.

System Embodiment 7A. The system of System Embodiment 7, wherein said audio signal is a digital signal that has been encoded using a telephony codec (e.g., an ITU-T G.711 A-law or Mu-law codec).

System Embodiment 7B. The system of System Embodiment 7, wherein said audio is a digital signal that has been encoded and compressed using a standards-based speech codec (e.g., an ITU-T G.729A or Adaptive Multi-Rate (AMR) codec).

System Embodiment 8. The system of System Embodiment 7, wherein said first processor further controls the audio fingerprinting device to perform the following operation: using the first audio fingerprint to determine if the first call is a robocall.

System Embodiment 8A. The system of System Embodiment 8, wherein said operation of using the first audio fingerprint to determine if the first call is a robocall includes comparing the first audio fingerprint to audio fingerprints generated from one or more different calls.

System Embodiment 8B. The system of System Embodiment 8, wherein using the first audio fingerprint to determine if the first call is a robocall includes: generating a set of fuzzy audio fingerprints from the first audio fingerprint and comparing the generated fuzzy audio fingerprints to audio fingerprints generated from one or more different calls to determine if there is a match.

System Embodiment 8B1. The system of System Embodiment 8B, wherein said first audio fingerprint is an ordered set of information including a first time, a first frequency bin, a second frequency bin, and a delta time; wherein said generating a set of fuzzy audio fingerprints from the first audio fingerprint includes modifying one or more of the following of the first audio fingerprint: the first frequency bin, the second frequency bin, or the delta time.

System Embodiment 9. The system of System Embodiment 2, wherein said first audio fingerprint is an ordered set of information including a first time, a first frequency bin, a second frequency bin, and a delta time; wherein said first frequency bin value corresponds to a first dominant frequency peak, said first dominant frequency peak being one of the identified dominant frequency peaks; wherein said second frequency bin value corresponds to a second dominant frequency peak, said second dominant frequency peak being one of the identified dominant frequency peaks, said first dominant frequency peak and said second dominant frequency peak being different dominant frequency peaks; wherein said first time is a first identified location in the audio signal corresponding to the first dominant frequency peak, said first time being a time corresponding to a first time segment of the plurality of time segments, said first dominant frequency peak appearing in said first time segment; wherein said delta time is a time difference between a second identified location in the audio signal corresponding to the second dominant frequency peak and the first identified location in the audio signal corresponding to the first dominant frequency peak.

System Embodiment 9A. The system of System Embodiment 2, wherein said first audio fingerprint is a tuple including a first time, a first frequency bin, a second frequency bin, and a delta time; wherein said first frequency bin corresponds to a first dominant frequency peak, said first dominant frequency peak being one of the identified dominant frequency peaks; wherein said second frequency bin corresponds to a second dominant frequency peak, said second dominant frequency peak being one of the identified dominant frequency peaks, said first dominant frequency peak and said second dominant frequency peak being different dominant frequency peaks; wherein said first time is a first identified location in the audio signal corresponding to the first dominant frequency peak, said first time being a time corresponding to a first time segment of the plurality of time segments, said first dominant frequency peak appearing in said first time segment; wherein said delta time is a time difference between a second identified location in the audio signal corresponding to the second dominant frequency peak and the first identified location in the audio signal corresponding to the first dominant frequency peak.

System Embodiment 9B. The system of System Embodiment 9, wherein said second identified location in the audio signal corresponding to the second dominant frequency peak is a second time corresponding to a second time segment in the audio signal in which the second dominant frequency peak appears.

System Embodiment 9C. The system of System Embodiment 9, wherein when the first dominant frequency peak and the second dominant frequency peak are located in the same time segment, said delta time is zero.

System Embodiment 10. The system of System Embodiment 2, wherein said first processor further controls the audio fingerprint device to perform the following operation: generating a first fingerprint-set for a first call, said audio signal being from said first call, said generating a first fingerprint-set for the first call including generating a plurality of audio fingerprints from the identified plurality of dominant frequency peaks and the identified positions in the audio signal corresponding to the identified peaks, said first audio fingerprint being one of said plurality of audio fingerprints.

System Embodiment 11. The system of System Embodiment 10, wherein said first processor further controls the audio fingerprint device to perform the following operation: generating a fingerprint-set dictionary for the first call, said fingerprint-set dictionary including a key value identifying individual fingerprints for the first call, and a list of time entries identifying individual fingerprints in the fingerprint-set for the call by the time in the audio signal to which the individual fingerprint corresponds.

System Embodiment 12. The system of System Embodiment 1, wherein said step of removing silence from the audio signal is performed using a voice activated detector (e.g., a low complexity voice activated detector).

System Embodiment 12A. The system of System Embodiment 1, wherein said operation of removing silence from the audio signal includes: (i) using voice activation detection to determine portions of the audio signal with a signal level less than a first threshold value (e.g., a low signal level), said portions of the audio signal being less than the first threshold value being determined to be silence; and (ii) removing portions of the audio signal determined to be silence.

System Embodiment 12B. The system of System Embodiment 12A, wherein said first threshold value is 60 dB.

System Embodiment 12C. The system of System Embodiment 12, wherein said operation of removing silence from the audio signal includes: (i) partitioning the audio signal into a plurality of different portions with each portion corresponding to a period of time (e.g., dividing the audio signal up into a plurality of 10 ms non-overlapping portions); (ii) each of the plurality of audio signal portions of the plurality of different portions is DC filtered and a sum-square magnitude is computed as a sum of sample value squares; and (iii) removing as silence any of the audio signal portions of the plurality of portions having a sum-square magnitude less than a first speech threshold value (e.g., $32*32*80$).

System Embodiment 12D. The system of System Embodiment 1, wherein said step of removing silence from the audio signal is performed by using voice activation detection to determine portions of the audio signal with low signal strength (e.g., less than 60 dB signal level) for a duration of time equal to or greater than a first time threshold value (e.g., 10 ms).

LISTING OF NUMBERED NON-TRANSITORY COMPUTER READABLE MEDIUM EMBODIMENTS

Non-transitory Computer Readable Medium Embodiment 1. A non-transitory computer readable medium including a first set of computer executable instructions which when executed by a processor of a computing device cause the computing device to: remove silence from an audio signal; determine, for a plurality of time segments of the audio signal, power spectral density values of the audio signal for each of a plurality of N different frequency bins, N being an integer greater than 1 (e.g., 513); identify (i) a plurality of dominant frequency peaks based on the determined power spectral density values, and (ii) positions in the audio signal corresponding to the identified peaks; and generate a first audio fingerprint from at least some of the identified plurality of dominant frequency peaks and the identified positions in the audio signal corresponding to the identified peaks.

Non-transitory Computer Readable Medium Embodiment 1A. The non-transitory computer readable medium of Non-transitory Computer Readable Medium Embodiment 1, wherein said computing device is a communications processing device.

Non-transitory Computer Readable Medium Embodiment 1B. The non-transitory computer readable medium of Non-transitory Computer Readable Medium Embodiment 1, wherein said computing device is a Session Border Controller; and wherein said Session Border Controller receives said audio signal as encoded audio, said first audio fingerprint being generated as said audio signal passes through said Session Border Controller.

The techniques of various embodiments may be implemented using software, hardware and/or a combination of software and hardware. Various embodiments are directed to apparatus, e.g., call processing devices, session border controllers, suspect robocall detector, classifiers, aggregators, aggregator & feature extractors, parser & aggregator, model parameterization, telecommunications systems, network nodes and/or network equipment devices. Various embodiments are also directed to methods, e.g., method of controlling and/or operating devices such as call processing devices, session border controllers, suspect robocall detector, classifiers, aggregators, aggregator & feature extractors, parser & aggregator, model parameterization, real-time communications entities, telecommunications systems, network nodes and/or network equipment devices. Various embodiments are also directed to machine, e.g., computer, readable medium, e.g., ROM, RAM, CDs, hard discs, etc., which include machine readable instructions for controlling a machine to implement one or more steps of a method. The computer readable medium is, e.g., non-transitory computer readable medium.

It is understood that the specific order or hierarchy of steps in the processes and methods disclosed is an example of exemplary approaches. Based upon design preferences, it is understood that the specific order or hierarchy of steps in the processes and methods may be rearranged while remaining within the scope of the present disclosure. The accompanying method claims present elements of the various steps in a sample order, and are not meant to be limited to the specific order or hierarchy presented. In some embodiments, one or more processors are used to carry out one or more steps or elements of the described methods.

In various embodiments each of the steps or elements of a method are implemented using one or more processors. In some embodiments, each of the steps or elements are implemented using hardware circuitry.

In various embodiments nodes and/or elements described herein are implemented using one or more components to perform the steps corresponding to one or more methods, for example, message reception, signal processing, sending, comparing, determining and/or transmission steps. Thus, in some embodiments various features are implemented using components or in some embodiments logic such as for example logic circuits. Such components may be implemented using software, hardware or a combination of software and hardware. Many of the above described methods or method steps can be implemented using machine executable instructions, such as software, included in a machine readable medium such as a memory device, e.g., RAM, floppy disk, etc. to control a machine, e.g., general purpose computer with or without additional hardware, to implement all or portions of the above described methods, e.g., in one or more nodes. Accordingly, among other things, various embodiments are directed to a machine-readable medium, e.g., a non-transitory computer readable medium, including machine executable instructions for causing a machine, e.g., processor and associated hardware, to perform one or more of the steps of the above-described method(s). Some embodiments are directed to a device, e.g., call processing device, session border controller, suspect robocall detector, classifier, aggregator, aggregator & feature extractor, parser & aggregator, model parameterization device, including a processor configured to implement one, multiple or all of the steps of one or more methods of the invention.

In some embodiments, the processor or processors, e.g., CPUs, of one or more devices, e.g., communications nodes such as call processing devices, session border controllers, robocall detectors are configured to perform the steps of the methods described as being performed by the communications nodes, e.g., session border controller, robocall detector, classifier, aggregator, aggregator & feature extractor, parser & aggregator, model parameterization device. The configuration of the processor may be achieved by using one or more components, e.g., software components, to control processor configuration and/or by including hardware in the processor, e.g., hardware components, to perform the recited steps and/or control processor configuration. Accordingly, some but not all embodiments are directed to a device, e.g., communications node such as a call processing device, a signaling session border controller or robocall detector with a processor which includes a component corresponding to each of the steps of the various described methods performed by the device in which the processor is included. In some but not all embodiments a device, e.g., communications node such as a call processing device or session border controller, includes a component corresponding to each of the steps of the various described methods performed by the device in which the processor is included. The components may be implemented using software and/or hardware.

Some embodiments are directed to a computer program product comprising a computer-readable medium, e.g., a non-transitory computer-readable medium, comprising code for causing a computer, or multiple computers, to implement various functions, steps, acts and/or operations, e.g., one or more steps described above. Depending on the embodiment, the computer program product can, and sometimes does, include different code for each step to be performed. Thus, the computer program product may, and sometimes does, include code for each individual step of a method, e.g., a method of controlling a session border controller or node. The code may be in the form of machine, e.g., computer, executable instructions stored on a computer-readable medium, e.g., a non-transitory computer-readable medium, such as a RAM (Random Access Memory), ROM (Read Only Memory) or other type of storage device. In addition to being directed to a computer program product, some embodiments are directed to a processor configured to implement one or more of the various functions, steps, acts and/or operations of one or more methods described above. Accordingly, some embodiments are directed to a processor, e.g., CPU, configured to implement some or all of the steps of the methods described herein. The processor may be for use in, e.g., a communications device such as a session border controller or other device described in the present application.

Numerous additional variations on the methods and apparatus of the various embodiments described above will be apparent to those skilled in the art in view of the above description. Such variations are to be considered within the scope. Numerous additional embodiments, within the scope of the present invention, will be apparent to those of ordinary skill in the art in view of the above description and the claims which follow. Such variations are to be considered within the scope of the invention.

What is claimed is:

1. A method of processing an audio signal comprising:

removing silence from the audio signal, said audio signal being from a first call;

after the silence has been removed from the audio signal, determining, for a plurality of time segments of the audio signal, power spectral density values of the audio signal for each of a plurality of N different frequency bins, N being an integer greater than 1;

identifying (i) a plurality of dominant frequency peaks based on the determined power spectral density values, and (ii) positions in the audio signal corresponding to the identified peaks;

generating a first audio fingerprint from at least some of the identified plurality of dominant frequency peaks and the identified positions in the audio signal corresponding to the identified peaks, said first audio fingerprint being an ordered set of information including: a first frequency bin value, a second frequency bin value, and a delta time, said first frequency bin value corresponding to a first dominant frequency peak, said first dominant frequency peak being one of the identified dominant frequency peaks, said second frequency bin value corresponding to a second dominant frequency peak, said second dominant frequency peak being one of the identified dominant frequency peaks, said first dominant frequency peak and said second dominant frequency peak being different dominant frequency peaks, said delta time being a time difference between a second identified location in the audio signal corresponding to the second dominant frequency peak and the first identified location in the audio signal corresponding to the first dominant frequency peak;

generating a first set of fuzzy audio fingerprints from the first audio fingerprint, said generating the first set of fuzzy audio fingerprints from the first audio fingerprint including modifying one or more of: the first frequency bin value or the second frequency bin value, said first frequency bin value identifying a first range of frequencies corresponding to a first frequency bin, said second frequency bin value identifying a second range of frequencies corresponding to a second frequency bin; and using the first audio fingerprint and the first set of fuzzy audio fingerprints to determine whether the first call is a robocall; and wherein said modifying includes performing one of the following:

(i) changing the first frequency bin value to a third frequency bin value, said third frequency bin value identifying a third range of frequencies corresponding to a third frequency bin, said third range of frequencies being different than said first range of frequencies, (ii) changing the second frequency bin value to a fourth frequency bin value, said fourth frequency bin value identifying a fourth range of frequencies corresponding to a fourth frequency bin, said fourth range of frequencies being different than said second range of frequencies, or (iii) changing the first frequency bin value to the third frequency bin value, said third frequency bin value identifying the third range of frequencies corresponding to the third frequency bin, said third range of frequencies being different than said first range of frequencies and changing the second frequency bin value to the fourth frequency bin value, said fourth frequency bin value identifying the fourth range of frequencies corresponding to the fourth frequency bin, said fourth range of frequencies being different than said second range of frequencies; and wherein said plurality of N different frequency bins includes said first frequency bin, said second frequency bin, said third frequency bin, and said fourth frequency bin.

2. The method of claim 1, wherein said identifying a plurality of dominant frequency peaks based on the determined power spectral density values includes: identifying for each of the plurality of time segments of the audio signal a set of frequency bins with the highest power spectral density values above a first threshold value, said set of frequency bins having M or fewer entries, where M is less than N, and where M is an integer; and wherein said identified positions in the audio signal corresponding to the identified peaks are times corresponding to the time segments in which the identified peaks appear.

3. The method of claim 2, wherein said first audio fingerprint further includes a first time;

wherein said first time is a first identified location in the audio signal corresponding to the first dominant frequency peak, said first time being a time corresponding to a first time segment of the plurality of time segments, said first dominant frequency peak appearing in said first time segment.

4. The method of claim 2, further comprising:

generating a first fingerprint-set for the first call, said generating a first fingerprint-set for the first call including generating a plurality of audio fingerprints from the identified plurality of dominant frequency peaks and the identified positions in the audio signal corresponding to the identified peaks, said first audio fingerprint being one of said plurality of audio fingerprints.

5. The method of claim 4, further comprising:

generating a fingerprint-set dictionary for the first call without using a hash function for audio fingerprints in the fingerprint-set dictionary, said fingerprint-set dictionary including a key value identifying individual fingerprints for the first call, and a list of time entries identifying individual fingerprints in the fingerprint-set for the call by the time in the audio signal to which the individual fingerprint corresponds.

6. The method of claim 1, further comprising:

performing, prior to said identifying (i) a plurality of dominant frequency peaks based on the determined power spectral density values, and (ii) positions in the audio signal corresponding to the identified peaks, a filtering operation on the audio signal to remove high frequency signals above a first frequency threshold level.

7. The method of claim 1, further comprising:

quantizing the determined power spectral density (PSD) values of the audio signal.

8. The method of claim 7, wherein said step of identifying (i) a plurality of dominant frequency peaks based on the determined power spectral density values, and (ii) positions in the audio signal corresponding to the identified peaks includes:

generating a spectrogram of power spectral density values based on: (i) said determined power spectral density values of the audio signal, (ii) the plurality of N different frequency bins, and (iii) the plurality of time segments; and applying a maximal filter to said spectrogram of power spectral density values to locate frequency peaks in said spectrogram.

9. The method of claim 8, wherein said step of identifying (i) a plurality of dominant frequency peaks based on the determined power spectral density values, and (ii) positions in the audio signal corresponding to the identified peaks further includes:

applying an erosion filter to said spectrogram of power spectral density values after applying said maximal filter.

10. The method of claim 1, wherein said audio signal is digitally encoded audio; and wherein said method of processing said audio signal further includes prior to determining, for a plurality of time segments of the audio signal, power spectral density values of the audio signal for each of a plurality of N different frequency bins:

decoding said digitally encoded audio; and converting a sampling rate for said audio to an 8 KHz sampling rate when said sampling rate is not 8 KHz.

11. The method of claim 1, wherein said step of removing silence from the audio signal includes: (i) using voice activation detection to determine portions of the audio signal with a signal level less than a first threshold value, said portions of the audio signal being less than the first threshold value being determined to be silence; and (ii) removing portions of the audio signal determined to be silence; and wherein said step of removing silence from the audio signal is performed using a voice activated detector.

12. The method of claim 1, further compromising:

receiving, by a Session Border Controller, the audio signal of the first call;

wherein said first audio fingerprint is generated in real-time by the Session Border Controller as said audio signal passes through said Session Border Controller.

13. The method of claim 1, wherein said generating the first set of fuzzy audio fingerprints from the first audio fingerprint further includes:

modifying the delta time of the first audio fingerprint.

14. The method of claim 1, wherein said generating the first set of fuzzy audio fingerprints from the first audio fingerprint including modifying one or more of: the first frequency bin value or the second frequency bin value includes:

modifying the first frequency bin value in a logarithmic manner based on the first frequency range to which the first frequency bin value corresponds.

15. A system for processing an audio signal comprising:

an audio fingerprinting device including a first processor, said first processor controlling the audio fingerprinting device to perform the following operations:

removing silence from the audio signal, said audio signal being from a first call;

after the silence has been removed from the audio signal, determining, for a plurality of time segments of the audio signal, power spectral density values of the audio signal for each of a plurality of N different frequency bins, N being an integer greater than 1;

identifying (i) a plurality of dominant frequency peaks based on the determined power spectral density values, and (ii) positions in the audio signal corresponding to the identified peaks;

generating a first audio fingerprint from at least some of the identified plurality of dominant frequency peaks and the identified positions in the audio signal corresponding to the identified peaks, said first audio fingerprint being an ordered set of information including: a first frequency bin value, a second frequency bin value, and a delta time, said first frequency bin value corresponding to a first dominant frequency peak, said first dominant frequency peak being one of the identified dominant frequency peaks, said second frequency bin value corresponding to a second dominant frequency peak, said second dominant frequency peak being one of the identified dominant frequency peaks, said first dominant frequency peak and said second dominant frequency peak being different dominant frequency peaks, said delta time being a time difference between a second identified location in the audio signal corresponding to the second dominant frequency peak and the first identified location in the audio signal corresponding to the first dominant frequency peak;

generating a first set of fuzzy audio fingerprints from the first audio fingerprint by modifying one or more of: the first frequency bin value or the second frequency bin value, said first frequency bin value identifying a first range of frequencies corresponding to a first frequency bin, said second frequency bin value identifying a second range of frequencies corresponding to a second frequency bin; and using the first audio fingerprint and the first set of fuzzy audio fingerprints to determine whether the first call is a robocall; and wherein said modifying includes performing one of the following:

(i) changing the first frequency bin value to a third frequency bin value, said third frequency bin value identifying a third range of frequencies corresponding to a third frequency bin, said third range of frequencies being different than said first range of frequencies, (ii) changing the second frequency bin value to a fourth frequency bin value, said fourth frequency bin value identifying a fourth range of frequencies corresponding to a fourth frequency bin, said fourth range of frequencies being different than said second range of frequencies, or (iii) changing the first frequency bin value to the third frequency bin value, said third frequency bin value identifying the third range of frequencies corresponding to the third frequency bin, said third range of frequencies being different than said first range of frequencies and changing the second frequency bin value to the fourth frequency bin value, said fourth frequency bin value identifying the fourth range of frequencies corresponding to the fourth frequency bin, said fourth range of frequencies being different than said second range of frequencies; and wherein said plurality of N different frequency bins includes said first frequency bin, said second frequency bin, said third frequency bin, and said fourth frequency bin.

16. The system of claim 15, wherein said identifying a plurality of dominant frequency peaks based on the determined power spectral density values includes: identifying for each of the plurality of time segments of the audio signal a set of frequency bins with the highest power spectral density values above a first threshold value, said set of frequency bins having M or fewer entries, where M is less than N, and where M is an integer; and wherein said identified positions in the audio signal corresponding to the identified peaks are times corresponding to the time segments in which the identified peaks appear.

17. The system of claim 15, wherein said first processor further controls the audio fingerprinting device to perform the following operations:

performing, prior to said identifying (i) a plurality of dominant frequency peaks based on the determined power spectral density values, and (ii) positions in the audio signal corresponding to the identified peaks, a filtering operation on the audio signal to remove high frequency signals above a first frequency threshold level.

18. The system of claim 15, wherein said first processor further controls the audio fingerprinting device to perform the following operations:

quantizing the determined power spectral density (PSD) values of the audio signal.

19. The system of claim 18, wherein said operation of identifying (i) a plurality of dominant frequency peaks based on the determined power spectral density values, and (ii) positions in the audio signal corresponding to the identified peaks includes:

generating a spectrogram of power spectral density values based on: (i) said determined power spectral density values of the audio signal, (ii) the set of frequency bins, and (iii) the plurality of time segments; and applying a maximal filter to said spectrogram of power spectral density values to locate frequency peaks in said spectrogram.

20. The system of claim 19, wherein said operation of identifying (i) a plurality of dominant frequency peaks based on the determined power spectral density values, and (ii) positions in the audio signal corresponding to the identified peaks further includes:

applying an erosion filter to said spectrogram of power spectral density values after applying said maximal filter.

21. The system of claim 15, wherein said audio signal is digitally encoded audio; and wherein said first processor controls the audio fingerprinting device prior to determining, for a plurality of time segments of the audio signal, power spectral density values of the audio signal for each of a plurality of N different frequency bins to perform the following operations:

40 decoding said digitally encoded audio; and converting a sampling rate for said audio to an 8 KHz sampling rate when said sampling rate is not 8 KHz.

22. A non-transitory computer readable medium including a first set of computer executable instructions which when executed by a processor of a computing device cause the computing device to:

remove silence from an audio signal, said audio signal being from a first call;

determine, for a plurality of time segments of the audio signal, power spectral density values of the audio signal for each of a plurality of N different frequency bins, N being an integer greater than 1;

identify (i) a plurality of dominant frequency peaks based on the determined power spectral density values, and (ii) positions in the audio signal corresponding to the identified peaks;

generate a first audio fingerprint from at least some of the identified plurality of dominant frequency peaks and the identified positions in the audio signal corresponding to the identified peaks, said first audio fingerprint being an ordered set of information including: a first frequency bin value, a second frequency bin value, and a delta time, said first frequency bin value corresponding to a first dominant frequency peak, said first dominant frequency peak being one of the identified dominant frequency peaks, said second frequency bin value corresponding to a second dominant frequency peak, said second dominant frequency peak being one of the identified dominant frequency peaks, said first dominant frequency peak and said second dominant frequency peak being different dominant frequency peaks, said delta time being a time difference between a second identified location in the audio signal corresponding to the second dominant frequency peak and the first identified location in the audio signal corresponding to the first dominant frequency peak;

generate a first set of fuzzy audio fingerprints from the first audio fingerprint by modifying one or more of: the first frequency bin value or the second frequency bin value, said first frequency bin value identifying a first range of frequencies corresponding to a first frequency bin, said second frequency bin value identifying a second range of frequencies corresponding to a second frequency bin; and use the first audio fingerprint and the first set of fuzzy audio fingerprints to determine whether the first call is a robocall; and wherein said modifying includes performing one of the following:

(i) changing the first frequency bin value to a third frequency bin value, said third frequency bin value identifying a third range of frequencies corresponding to a third frequency bin, said third range of frequencies being different than said first range of frequencies, (ii) changing the second frequency bin value to a fourth frequency bin value, said fourth frequency bin value identifying a fourth range of frequencies corresponding to a fourth frequency bin, said fourth range of frequencies being different than said second range of frequencies, or (iii) changing the first frequency bin value to the third frequency bin value, said third frequency bin value identifying the third range of frequencies corresponding to the third frequency bin, said third range of frequencies being different than said first range of frequencies and changing the second frequency bin value to the fourth frequency bin value, said fourth frequency bin value identifying the fourth range of frequencies corresponding to the fourth frequency bin, said fourth range of frequencies being different than said second range of frequencies; and wherein said plurality of N different frequency bins includes said first frequency bin, said second frequency bin, said third frequency bin, and said fourth frequency bin.

23. A method of processing an audio signal comprising:

removing silence from the audio signal, said audio signal being from a first call;

after the silence has been removed from the audio signal, determining, for a plurality of time segments of the audio signal, power spectral density values of the audio signal for each of a plurality of N different frequency bins, N being an integer greater than 1;

identifying (i) a plurality of dominant frequency peaks based on the determined power spectral density values, and (ii) positions in the audio signal corresponding to the identified peaks;

generating a first audio fingerprint from at least some of the identified plurality of dominant frequency peaks and the identified positions in the audio signal corresponding to the identified peaks, said first audio fingerprint being an ordered set of information including: a first frequency bin value, a second frequency bin value, and a delta time, said first frequency bin value corresponding to a first dominant frequency peak, said first dominant frequency peak being one of the identified dominant frequency peaks, said second frequency bin value corresponding to a second dominant frequency peak, said second dominant frequency peak being one of the identified dominant frequency peaks, said first dominant frequency peak and said second dominant frequency peak being different dominant frequency peaks, said delta time being a time difference between a second identified location in the audio signal corresponding to the second dominant frequency peak and the first identified location in the audio signal corresponding to the first dominant frequency peak;

generate a first set of fuzzy audio fingerprints from the first audio fingerprint, said generating the first set of fuzzy audio fingerprints from the first audio fingerprint including modifying one or more of the following of the first audio fingerprint: the first frequency bin value or the second frequency bin value; and using the first audio fingerprint and the first set of fuzzy audio fingerprints to determine whether the first call is a robocall; and wherein said generating the first set of fuzzy audio fingerprints from the first audio fingerprint including modifying one or more of the following of the first audio fingerprint: the first frequency bin value or the second frequency bin value includes:

generating a first fuzzy audio fingerprint and a second fuzzy audio fingerprint, said generating the first fuzzy audio fingerprint and the second fuzzy audio fingerprint including:

generating the first fuzzy audio fingerprint by adding 1 to the first frequency bin value when the first frequency bin value is a value greater than 1 and less than 64; and generating the second fuzzy audio fingerprint by subtracting 1 from the first frequency bin value when the first frequency bin value is a value greater than 1 and less than 64; and generating the first fuzzy audio fingerprint by adding 2 to the first frequency bin value when the first frequency bin value is a value equal to or greater than 64 and less than 128; and generating the second fuzzy audio fingerprint by subtracting 2 from the first frequency bin value when the first frequency bin value is a value equal to or greater than 64 and less than 128; and generating the first fuzzy audio fingerprint by adding 4 to the first frequency bin value when the first frequency bin value is a value equal to or greater than 128 and less than 256; and generating the second fuzzy audio fingerprint by subtracting 4 from the first frequency bin value when the first frequency bin value is a value equal to or greater than 128 and less than 256.

24. The method of claim 23, wherein a 1024 point Fast Fourier Transform (FFT) is utilized for said determining, for a plurality of time segments of the audio signal, power spectral density values of the audio signal for each of a plurality of N different frequency bins;

wherein each of the time segments of the audio signal have been sampled at an 8000 Hz sample rate;

wherein the first frequency bin value is a quantized frequency value in the range of (0, 256) corresponding to 0-2000 Hz; and wherein the second frequency bin value is a quantized frequency value in the range of (0, 256) corresponding to 0-2000 Hz.

* * * * *